United States Patent
Van Schuylenbergh et al.

(10) Patent No.: US 7,121,859 B2
(45) Date of Patent: Oct. 17, 2006

(54) FLEXIBLE CABLE INTERCONNECT ASSEMBLY

(75) Inventors: Koenraad F. Van Schuylenbergh, Sunnyvale, CA (US); Armin R. Völkel, Mountain View, CA (US); Thomas H. DiStefano, Monte Sereno, CA (US); Michel A. Rosa, SanJose, CA (US); David K. Fork, Los Altos, CA (US); Eugene M. Chow, Mountain View, CA (US); Meng H. Lean, Santa Clara, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 0 days.

(21) Appl. No.: 11/226,186

(22) Filed: Sep. 13, 2005

(65) Prior Publication Data

US 2006/0009051 A1 Jan. 12, 2006

Related U.S. Application Data

(62) Division of application No. 10/742,501, filed on Dec. 19, 2003, now Pat. No. 6,966,784.

(51) Int. Cl.
*H01R 13/15* (2006.01)
(52) U.S. Cl. .................. 439/260; 439/498; 439/67; 361/803; 361/261; 361/788
(58) Field of Classification Search ............... 439/260, 439/498, 267, 67, 77; 361/803, 749, 784, 361/750, 788, 796, 261; 174/254, 261, 258, 174/268
See application file for complete search history.

(56) References Cited

U.S. PATENT DOCUMENTS

| | | | |
|---|---|---|---|
| 3,065,446 A | 11/1962 | Robb et al. | |
| 3,796,986 A | 3/1974 | Tamburro | |
| 4,116,516 A | 9/1978 | Griffin | |
| 4,644,101 A | 2/1987 | Jin et al. | |
| 4,693,529 A | 9/1987 | Stillie | |
| 4,737,112 A | 4/1988 | Jin et al. | |
| 4,744,764 A * | 5/1988 | Rubenstein | 439/62 |
| 4,778,635 A | 10/1988 | Hechtman et al. | |
| 4,828,512 A | 5/1989 | McCormick et al. | |
| 4,890,381 A | 1/1990 | Dubois et al. | |
| 4,913,662 A * | 4/1990 | Noy | 439/498 |
| 4,997,377 A | 3/1991 | Goto et al. | |
| 5,045,249 A | 9/1991 | Jin et al. | |
| 5,071,357 A * | 12/1991 | Van Brunt et al. | 439/67 |
| 5,081,552 A * | 1/1992 | Glaser et al. | 360/98.01 |
| 5,155,302 A | 10/1992 | Nguyen | |
| 5,213,511 A | 5/1993 | Sobhani | |
| 5,304,460 A | 4/1994 | Fulton et al. | |

(Continued)

*Primary Examiner*—Gary F. Paumen
(74) *Attorney, Agent, or Firm*—Bever, Hoffman & Harms, LLP; Patrick T. Bever

(57) ABSTRACT

A data transmission interconnect assembly capable of transmission speeds in excess of 40 Gbps in which, for example, a line-card is detachably coupled to a backplane using flexible flat cables that are bent to provide a continuous, smooth curve between the connected boards, and connected by a connection apparatus that employs cable-to-cable interface members that are transparent to the transmitted signal waves. Microspring interface members are formed on the contact structure pressed against the cables to provide interface arrangements that are smaller than a wavelength of the transmitted signal. A connector apparatus uses a cam mechanism to align the cables, and then to press the contact structure, having the microspring interface members formed thereon, against the cables. An alterative contact structure uses anisotropic conductive film.

9 Claims, 10 Drawing Sheets

U.S. PATENT DOCUMENTS

| | | | |
|---|---|---|---|
| 5,501,610 A * | 3/1996 | Ikemoto | 439/498 |
| 5,587,620 A | 12/1996 | Ruby et al. | |
| 5,735,709 A * | 4/1998 | Hashiguchi et al. | 439/495 |
| 5,993,247 A | 11/1999 | Kidd | |
| 6,017,244 A | 1/2000 | Daane | |
| 6,053,747 A * | 4/2000 | Aggus et al. | 439/67 |
| 6,077,090 A | 6/2000 | Campbell et al. | |
| 6,109,927 A * | 8/2000 | Scholz et al. | 439/65 |
| 6,123,551 A | 9/2000 | Westfall | |
| 6,247,951 B1 | 6/2001 | Di Liello et al. | |
| 6,447,308 B1 | 9/2002 | McCarthy et al. | |
| 6,497,583 B1 | 12/2002 | Weiss et al. | |
| 6,508,661 B1 * | 1/2003 | Yu | 439/495 |
| 6,520,789 B1 | 2/2003 | Daugherty, Jr. et al. | |
| 6,670,042 B1 | 12/2003 | Furuta et al. | |
| 6,679,716 B1 * | 1/2004 | Nakagawa et al. | 439/267 |
| 6,721,189 B1 | 4/2004 | Haba | |
| 6,722,915 B1 * | 4/2004 | McAlonis et al. | 439/498 |
| 6,786,737 B1 | 9/2004 | Tai et al. | |
| 6,966,784 B1 * | 11/2005 | Van Schuylenbergh et al. | 439/67 |
| 2002/0086566 A1 | 7/2002 | Simons | |
| 2003/0032310 A1 | 2/2003 | Weiss et al. | |
| 2003/0064613 A1 | 4/2003 | Weiss et al. | |
| 2003/0077391 A1 | 4/2003 | Simons | |
| 2003/0096512 A1 | 5/2003 | Cornell | |
| 2003/0166355 A1 | 9/2003 | Simons et al. | |
| 2003/0181071 A1 | 9/2003 | Weiss et al. | |
| 2005/0136703 A1 * | 6/2005 | Van Schuylenbergh et al. | 439/67 |
| 2006/0009051 A1 * | 1/2006 | Schuylenbergh et al. | 439/67 |

* cited by examiner

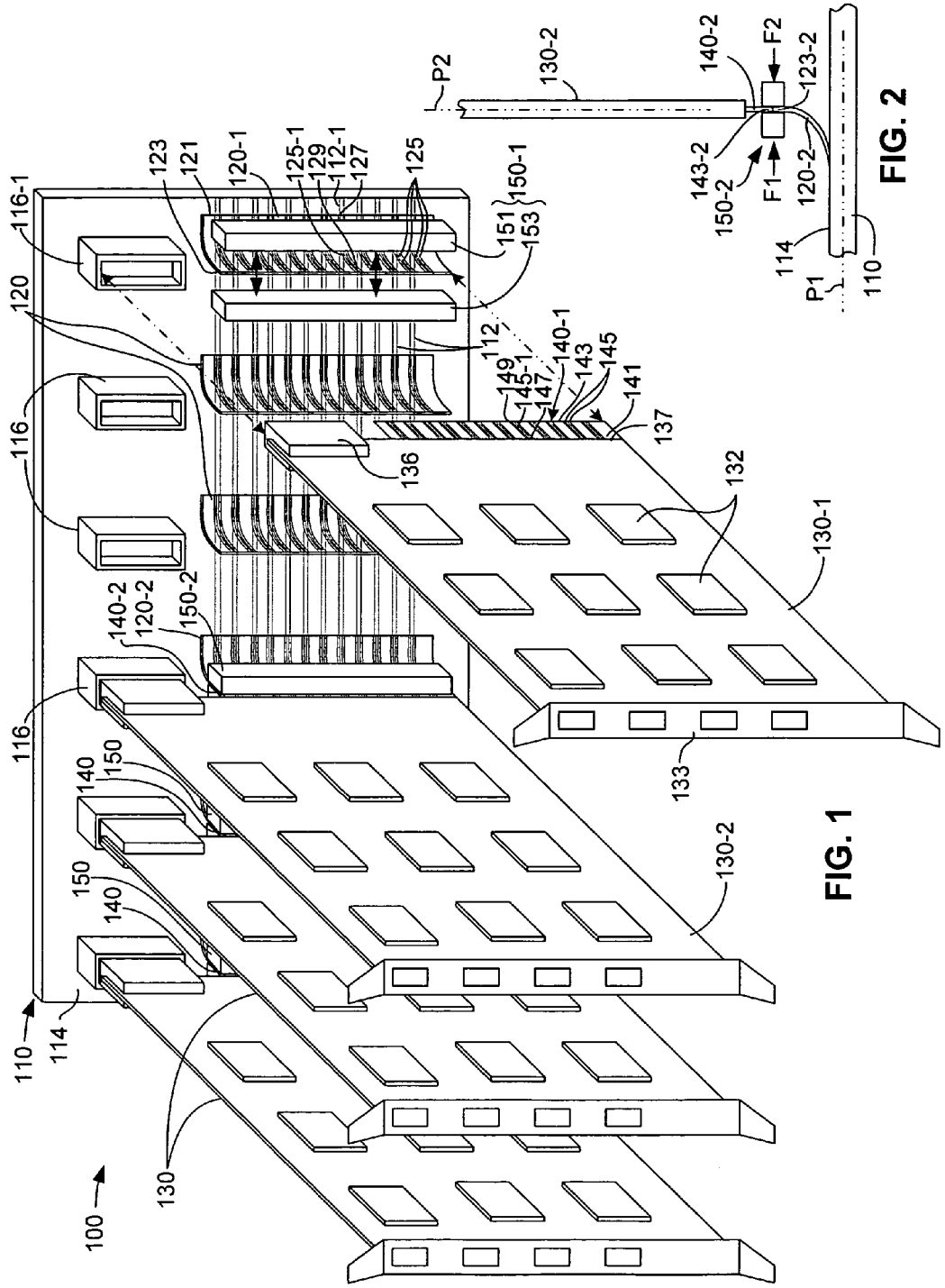

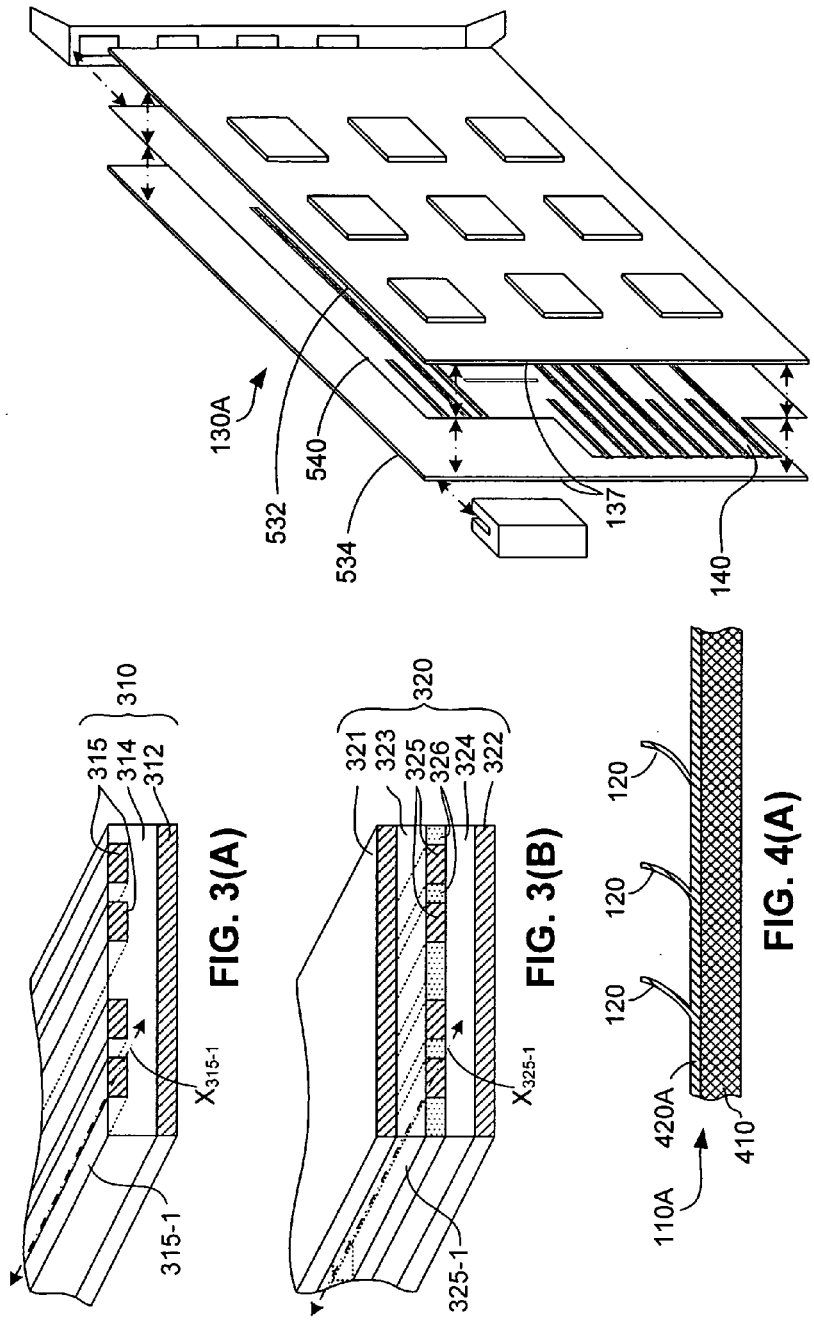
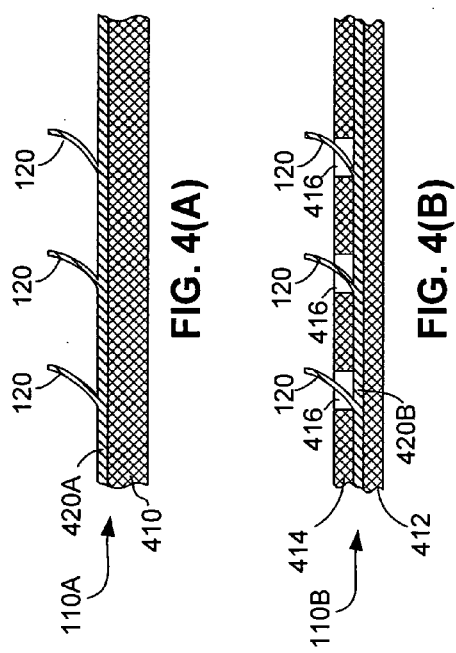
FIG. 5
FIG. 3(A)
FIG. 3(B)
FIG. 4(A)
FIG. 4(B)

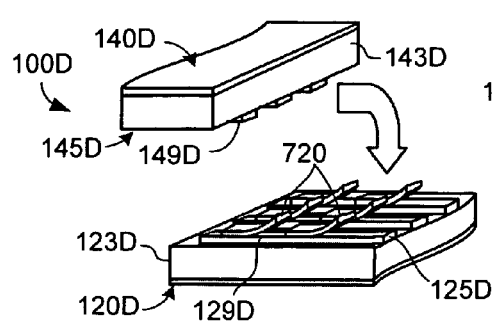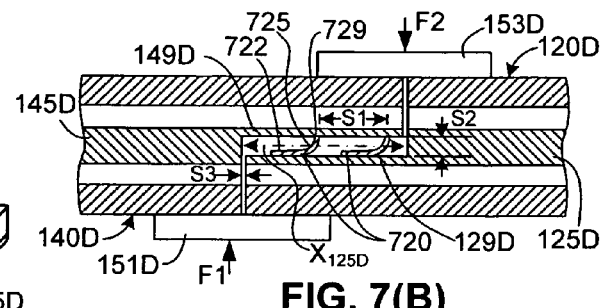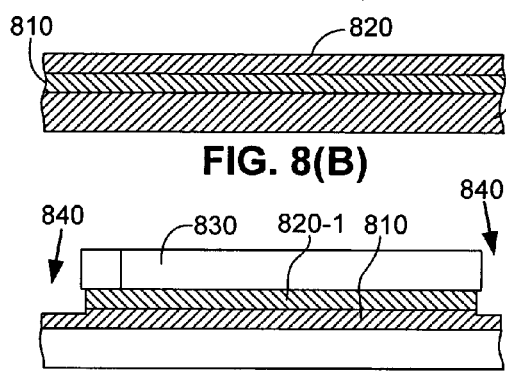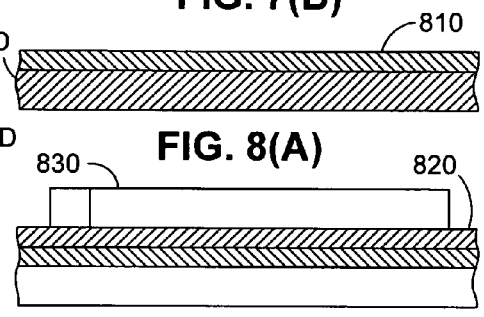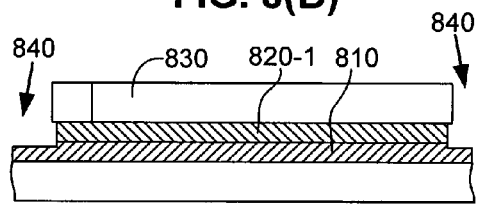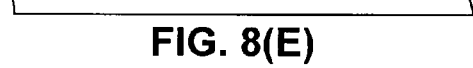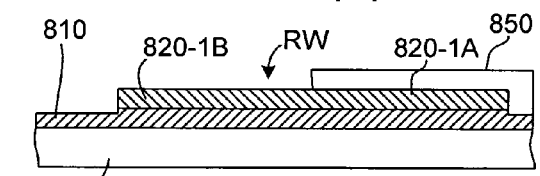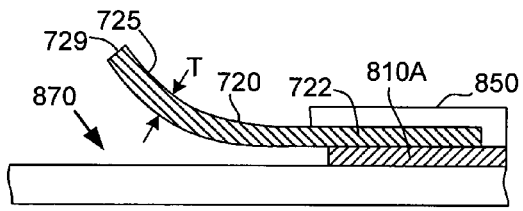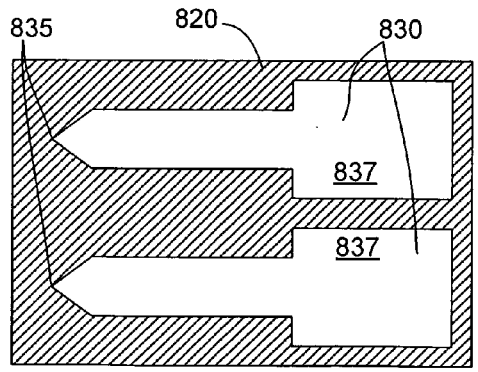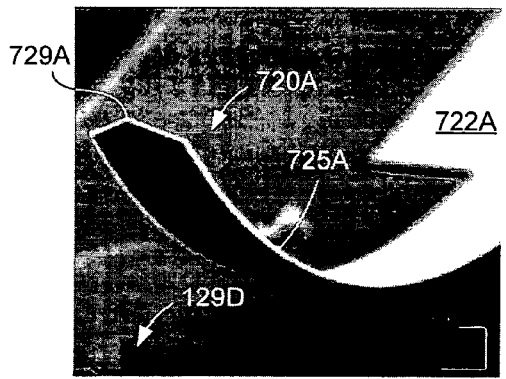

FLEXIBLE CABLE INTERCONNECT ASSEMBLY

RELATED APPLICATIONS

This application is a divisional of U.S. patent application Ser. No. 10/742,501, entitled "FLEXIBLE CABLE INTERCONNECT ASSEMBLY", filed Dec. 19, 2003, now U.S. Pat. No. 6,966,784.

FIELD OF THE INVENTION

This invention relates to electronic communication systems, and more particularly to interconnect assemblies used to facilitate the transmission of electronic signals between two or more detachably coupled circuit boards in an electronic communication system.

BACKGROUND OF THE INVENTION

FIGS. 28 and 29 are perspective views showing a conventional high-speed network router/server unit 50. Unit 50 includes a housing 51 that is configured to hold two system racks 52 and 53, each rack including an interconnect assembly 60 (shown in FIG. 29) made up of several active circuit cards (herein "line-cards") 65 that are plugged into a passive "backplane" circuit board 70 (shown in FIG. 29). Within conventional interconnect assembly 60, backplane 70 functions to distribute power and card-to-card data transmissions to the various line-cards 65 connected thereto, and line-cards 65 perform various system-related communication functions.

Referring to FIG. 29, each backplane 70 is fabricated using conventional FR4 technology, and typically includes several power connectors 72 that are connected to a shared power bus 73, and several data connectors 74 that are connected to a data bus 75. Connectors 72 and 74 are pin-based connectors that facilitate manual "swapping" linecards 65 by way of manually unplugging an older line-card, and plugging in a newer line-card. As indicated in FIG. 29, to facilitate convenient unplugging and plugging, this arrangement works best when line-cards 65 are mounted perpendicular to backplane 70.

Interconnect assemblies, such as those used in router/server unit 50, often stay in service for up to 10 years. During this time, the line-cards are typically replaced several times with newer, enhanced line-cards that typically support higher transmission speeds. While the enhanced line-cards provide some improvement in system operating speeds, the standard FR4 construction and pin-based connectors associated with conventional backplane structures typically limit card-to-card transmission speeds in these conventional interconnect assemblies to a few Gigabits-per-second (Gbps) per signal line.

Several problems must be addressed in order to provide an interconnect assembly that facilitates high (i.e., multi-Gbps per signal line) card-to-card communication speeds. For example, at high speeds, signal wavelengths become very small (i.e., the signal wavelength of a 40 Gbps signal is a few millimeter). Conventional pin-type connectors, which are fine for lower speed (i.e., long wavelength) transmissions, can easily span a substantial fraction of a wavelength when subjected to high-speed transmissions, and thus act as transmission lines. Further, signal fidelity requires controlling the characteristic impedance of the transmission line throughout its entire signal path, including all connector interfaces, properly terminating each line to avoid signal reflections, and avoiding line stubs. These requirements are difficult to meet due to the pin-based connection structures used in conventional backplanes. Moreover, the parallel data bus structure often utilized in conventional backplanes becomes unpractical because unused bus sections act as transmission line stubs. It is also very hard to maintain bus impedance without knowing where and whether line-cards are plugged in.

One solution to problems associated with conventional interconnect assemblies is to produce a backplane having point-to-point connections (i.e., where the backplane routes individual data lines from every line-card to every other line-card). However, a parallel point-to-point solution is impractical due to the large number of connections required in such a backplane. The number of point-to-point connections is lowered by adopting a serial transmission protocol, which requires fewer pins (connections) per line-card, but increases the data rates per pin accordingly. However, high data rates potentially create signal integrity problems as they call for rapid pulse fall and rise times. Quickly charging and discharging trace and input capacitances requires large transient currents that cause cross talk, ground bounce, radiation, electromagnetic interference and other signal integrity issues. Moreover, along with the ever-increasing clock rates utilized in cutting-edge systems, supply voltages continue to decrease to tame dynamic power consumption (e.g., microprocessor cores now run at 1 Volt or lower). Noise margins reduced accordingly making circuits more sensitive to signal integrity problems.

Optical fiber data transmission is therefore being used with increasing frequency. Although substantially more expensive than conventional FR4/pin-connector based assemblies, until recently fiber optic-based interconnect assemblies provided the only option for interconnect speeds of greater than 5 Gbps per data line.

A more recently developed solution involves modifying FR4-based backplanes and line card circuits to include differential signaling over copper transmission lines. This solution is simpler and potentially more economical than optical fiber-based assemblies. Perfectly balanced differential signals do not create any ground currents, and the common-mode rejection of the differential receiver cancels ground disturbances. This technique has been routinely used in interconnect assemblies at speeds of 5 Gbps per data line, and up to 10 Gbps when heroic circuit design efforts are employed. However, these differential signal interconnect assemblies appear to support a maximum transmission speed of 10 Gbps because of FR4 dielectric loss and propagation mode mismatch at the pin-based connectors.

What is needed is an interconnect assembly that overcomes the deficiencies of conventional interconnect systems, described above, and facilitates operating speeds greater than 10 Gbps.

SUMMARY OF THE INVENTION

The present invention is directed to methods and interconnect assembly structures that facilitate high-speed data transmissions of 40 Mbps per data line or greater in communication systems (e.g., router systems in which line-cards are detachably coupled to a backplane). The invention utilizes printed circuit board (PCB) structures formed using low-loss dielectric materials (in place of standard FR4), flexible cables (e.g., stripline multicables or surface microstrips) that are integrated into the PCB structures and bent to provide a continuous, smooth curve between the coupled circuit boards, and cable-to-cable interface structures that are transparent to the transmitted signal waves. Implementing at least some of these modifications provides an interconnect assembly having greatly improve board-to-board transmission speeds, when compared with conventional interconnect assembly arrangements. Implementing all of these modifications to produce the specific interconnect assemblies described herein facilitates board-to-board transmission speeds of 40 Gbps or more, far exceeding the maximum sustainable transmission speeds supported by conventional printed circuit interconnect arrangements.

In accordance with an embodiment of the present invention, the interconnect assembly includes a backplane PCB integrally formed with a first flexible cable, and one or more line-card PCBs, each integrally formed with an associated second flexible cable. The line-card PCB is mounted at a non-parallel (e.g., perpendicular) angle relative to the backplane PCB, and at least one of the first and second flexible cables are bent to form a continuous curve between a first plane defined by the backplane PCB and a second plane defined by the line-card PCB. A connector apparatus secures the free ends of the first and second flexible cables such that elongated conductors, which extend along the first and second flexible cables, are aligned to minimize signal reflections. The free end of each flexible cable is stripped or otherwise processed to expose the conductor tips, and the connector apparatus secures the flexible cables such that each exposed conductor tip on the first flexible cable is aligned with and electrically coupled through a selected interface structure (i.e., either directly via special interface members, or over a contact structure including such interface members) to an associated exposed conductor tip on the second flexible cable, thereby providing electrical connection between the line-card and the backplane.

In accordance with another embodiment of the present invention, an interconnect assembly includes several conductive micro spring finger-type interface members extending between the exposed conductor tips of the two flexible cables to facilitate highly efficient signal transmissions between flexible cables. Each micro spring finger is formed with an internal stress or strain gradient, and includes an anchor portion attached to the cable and a free portion formed on a release (i.e., sacrificial) material pad. When the release material is subsequently removed (e.g., by etching), the free end of each micro spring finger bends away from the exposed conductor tip. When the exposed conductor tip of the cable having the spring finger is then contacted against an associated conductor tip of a second cable, the micro spring fingers provide multiple redundant contact points to assure reliable transfer of transmitted signals between the first conductor and the associated conductor. According to an aspect of the invention, impedance and wave-mode are matched throughout the conductor interface, and the spring fingers are arranged such that the interface is smaller (narrower) than a fraction of the transmitted signal wavelength, thereby avoiding parasitic resonances and increasing transmission speeds over conventional arrangements.

According to another embodiment of the present invention, an apparatus for securing the first flexible cable to the second flexible cable includes an alignment structure for aligning the first and second cables in an optimal position, and a contact structure that provides a conductive bridge between the exposed conductor tips to provide conduction between the flexible cables (and, thus, between the PCBs connected to the flexible cables). The contact structure includes multiple conductive strips that spans across the exposed conductor tips, and several interface members (e.g., spring fingers or conduction paths formed in an anisotropical conductive film element) that are positioned at the end of each conductive strip to facilitate reliable conduction between each conductive strip and the exposed tips of an associated pair of conductors. In a specific embodiment, a cam mechanism controls the alignment mechanism to secure the first and second flexible cables in the optimal position before pressing the contact structure against the exposed conductor tips, thereby preventing damage to the interface members. In various specific embodiments, one or two contact structures are utilized to couple the various signal lines (conductors) and ground planes of the coupled cables. In yet other specific embodiments, specially designed cables, and cables having multiple layers of elongated conductors, are coupled using various contact structures.

BRIEF DESCRIPTION OF THE DRAWINGS

These and other features, aspects and advantages of the present invention will become better understood with regard to the following description, appended claims, and accompanying drawings, where:

FIG. 1 is a perspective side view showing an interconnect assembly according to an embodiment of the present invention;

FIG. 2 is a simplified top plan view showing a connection between a line-card and a backplane of the interconnect assembly of FIG. 1;

FIGS. 3(A) and 3(B) are perspective views showing alternative flexible cable structures utilized in the interconnect assembly of FIG. 1;

FIGS. 4(A) and 4(B) are simplified cross-sectional side views showing alternative backplane structures utilized in the interconnect assembly of FIG. 1;

FIG. 5 are is an exploded perspective view showing a line-card structure utilized in the interconnect assembly of FIG. 1;

FIGS. 7(A) and 7(B) are perspective and cross-sectional side views, respectively, showing portions of an interconnect assembly according to a specific embodiment of the present invention;

FIGS. 8(A), 8(B), 8(C), 8(D), 8(E), 8(F), and 8(G) are simplified cross-sectional side views showing a general fabrication process utilized to produce micro spring fingers according to another embodiment of the present invention;

FIG. 9 is a top view showing a spring mask formed over a spring material film during the fabrication process shown in FIG. 8(C);

FIG. 10 is an enlarged photograph showing a micro spring finger produced using the fabrication process described with reference to FIGS. 8(A) through 8(G) and FIG. 9;

FIGS. 13(A) through 13(C) in additional detail;

DETAILED DESCRIPTION OF THE DRAWINGS

Figure 28:
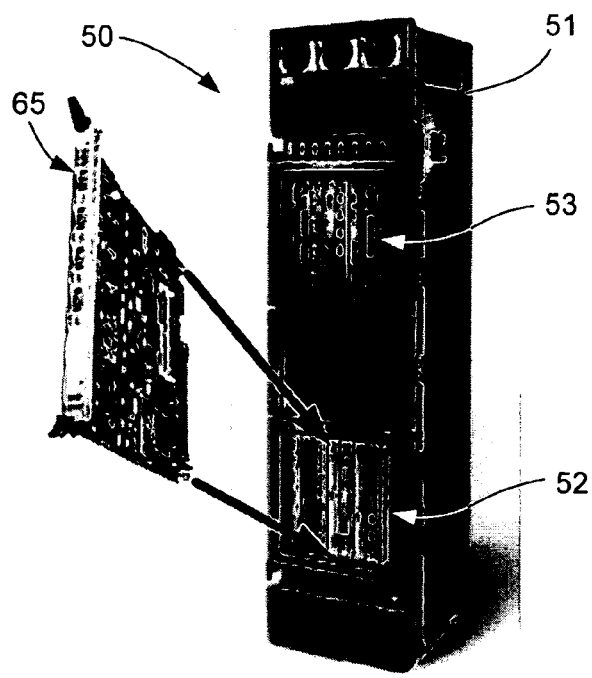
FIG. 28 is a photograph showing a conventional high-speed network router/server unit.
Figure 29:
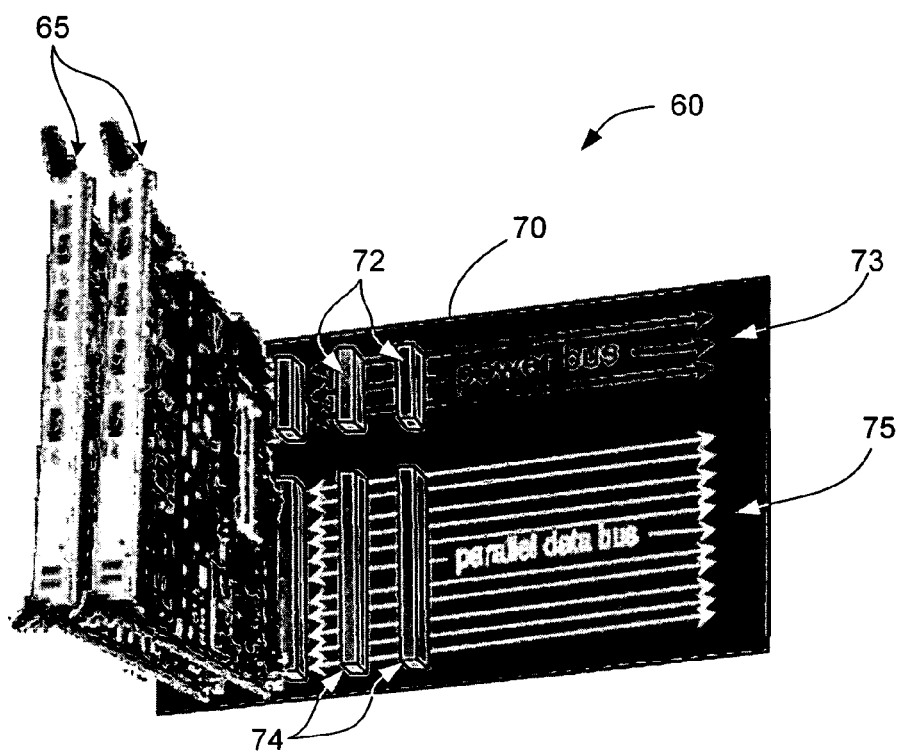
FIG. 29 is a perspective view showing a conventional interconnect assembly utilized in the conventional unit shown in FIG. 28.

FIG. 1 is a perspective view showing an interconnect assembly 100 including a backplane (first PCB) 110 and several line-cards (second PCBs) 130 that are detachably coupled to backplane 110 in accordance with an embodiment of the present invention. As used herein, the term "detachably coupled" indicates that each line-card 130 is coupled to backplane 110 by way of a connector structure (generally depicted as two-part connector apparatus 150) that facilitates non-destructive de-coupling in response to relatively simple manipulation (i.e., as opposed to destructive de-coupling by way of, e.g., cutting a cable, or otherwise damaging a portion of either circuit board to effect separation). Although shown by itself in FIG. 1, assembly 100 is understood to be incorporated, for example, in a router housing similar to that shown in FIG. 28, and preferably replaces the conventional interconnect assembly 60 that is shown in FIG. 29. In addition to the single shelf arrangement shown in FIG. 1, one or more line-cards 110 may be connected to backplanes located on other shelves (not shown) of a router cabinet. Note also that the novel aspects of interconnect assembly 100 may be utilized in any high-speed system including multiple interconnected circuit boards that are routinely coupled and de-coupled from each other, or from a "host" circuit board (e.g., backplane 110).

Backplane 110 includes several parallel fixed conductors 112 (indicated by hidden/dashed lines) that are disposed within two or more layers of dielectric material in a manner similar to that currently utilized in conventional PCB technology. In addition, extending from a front (first) surface 114 of backplane 110 are several sockets 116 and several (first) flexible cables 120. Sockets 116 are in one embodiment conventional power socket structures similar to those described above, and each socket 116 is coupled, for example, to power and slow speed communication lines (not shown) that are formed on backplane 110 using conventional techniques. Conversely, each flexible cable 120 (e.g., cable 120-1 located at the right side of FIG. 1 includes a fixed (first) end 121 connected to backplane 110, a free (second) end 123 extending away from front surface 114, and several of parallel (first) flexible conductors 125 extending between the fixed and free ends. In addition, each flexible conductor 125 (e.g., flexible conductor 125-1) has a fixed end 127 connected to a corresponding fixed conductor (e.g., conductor 112-1), and an exposed end (tip) 129 that is located adjacent to free end 123 of flexible cable 120.

Each line-card 130 (e.g., line-card 130-1) typically includes several integrated circuits 132 mounted on one or both surfaces that are electrically connected to conductors (not shown) disposed within two or more layers of dielectric material in a manner similar to that currently utilized in conventional PCB technology. Each line-card 130 includes a mounting fixture 133 mounted on a front edge, a power/low-speed communication plug 136 mounted on a back edge 137, and a (second) flexible cable 140 extending from back edge 137. Plugs 136 are in one embodiment conventional power connector structures similar to those described above, and each plug 136 is coupled, for example, to power and slow speed communication lines associated with the operation of line-card 130. Each flexible cable 140 (e.g., flexible cable 140-1, extending from line-card 130-1) includes a fixed (first) end 141 extending into its associated line-card through edge 137, a free (second) end 143 extending away from back edge 137, and several of parallel (first) flexible conductors 145 extending between the fixed and free ends. In addition, each flexible conductor 145 (e.g., flexible conductor 145-1) has a fixed end 147 connected to a corresponding circuit structure (not specified) of line-card 130, and an exposed free end (tip, or exposed portion) 149 that is located adjacent to second end 143 of flexible cable 140-1.

Connector apparatus 150 are provided in assembly 100 to facilitate detachable coupling of associated flexible cables 120 and flexible cables 140. In general, the function of connector apparatus 150 is to secure free end 123 of each flexible cable 120 to free end 143 of a corresponding flexible cable 140 such an exposed end 129 of each conductor 125 on the flexible cable 120 is electrically coupled to a corresponding exposed free end 149 of an associated conductor 145 of the corresponding flexible cable 140, thereby facilitating electrical transmissions between line-card 130 and backplane 110. In the embodiment shown in FIG. 1, each connector apparatus 150 (e.g., connector apparatus 150-1 located at the right end of backplane 110) is depicted as a simplified structure including a first contact structure 151 and a second contact structure 153 that cooperate to sandwich corresponding flexible cables in the manner described below. Other specific embodiments of suitable connector structures are disclosed herein. In addition to the disclosed structures, those of ordinary skill in the art will recognize that several alternative connector apparatus may be utilized to connect the flexible cables in a manner consistent with the present invention. Therefore, unless otherwise specified, the claims should not be limited by these disclosed structures.

According to an aspect of the present invention, interconnect assembly 100 incorporates a threefold paradigm shift relative to conventional FR4-based assemblies to increase the limits of electrical signaling, and to create an alternative to conventional optical interconnects.

As a first aspect of this threefold paradigm shift, backplane 110 and line cards 130 are constructed such that they integrate flexible cables 120 and 140, respectively, and utilize dielectric materials for those flexible cables that exhibit a dielectric loss tangent well below the 2.5% figure typical of standard FR4 (which is used in conventional PCB construction). Suitable low-loss dielectric materials include, for example, BIAC™ LCP (W.L. Gore and Associates, Inc., of Newark, Del.), DuPont Pyralux low-loss polyimide, and RT/duroid$^R$ (produced by Rogers Corporation of Chandler Ariz.). Although potentially more expensive than standard FR4, these lower dielectric loss materials greatly facilitate higher transmission rates. Note also that, although transmission rates may not be optimal, the other aspects of the present invention, described below, may be utilized with circuit boards formed using standard FR4. Moreover, FR4 may be used to form a rigid base upon which the low-loss flexible cables are mounted. For example, as described herein, backplane 110 includes low-loss flexible cables laminated onto at least one FR4 board, with ends of the flexible cables extending away from the board as described below.

A second aspect of the threefold paradigm shift involves bending flexible cables 120 and 140 to facilitate low impedance transfer of high-speed signals between non-parallel circuit boards. As indicated in FIGS. 1 and 2, consistent with conventional arrangements, each line-card 130 (e.g., line-card 130-2) is mounted such that a plane P2 defined by line-card 130-2 is oriented in a non-parallel angle relative to a plane P1 defined by backplane 110. Typically, the angle formed by these planes is 90°, as indicated in FIGS. 1 and 2, but it is understood that the benefits associated with the present invention also apply to assemblies in which the respective circuit boards are oriented in other non-parallel angles. According to an aspect of the present invention, at least one of flexible cable 120-1 and flexible cable 140-1 are bent to form a smooth, continuous curve between plane P1 and plane P2, thereby avoiding the sharp 90° turn that is required in conventional pin-based backplane connectors, which is a leading source of propagation mode mismatch. Additional benefits and features of this aspect are discussed with reference to the specific embodiments, described below.

A third aspect of the threefold paradigm shift involves the use of connector apparatus 150 to connect flexible cables 120 and 140 such that the interface between each associated pair of flexible cables is transparent to the signal waves transmitted between the cables. Signal wave transparency requires a constant characteristic impedance throughout the cable-connector-cable system for every section perpendicular to the direction of the wave propagation. Local variations are only allowed in regions much shorter than a wavelength in the direction of the wave propagation to avoid them causing parasitic resonances and/or signal reflections. Signal wave transparency also requires that the location and orientation of the electromagnetic fields with respect to the signal and ground conductors are maintained throughout the connector cable-connector system. Local variations are again only allowed in regions much shorter than a wavelength in the direction of the wave propagation, again avoiding parasitic resonances and/or signal reflections. According to an aspect of the present invention, creating a cable-connector interface with small enough regions of local impedance and electromagnetic field variations (referred to below as "interface artifacts") involves aligning the conductors such that discontinuities between the exposed conductor tips are minimized. For example, as indicated in FIG. 2 and described in additional detail below, free ends 123-2 and 143-2 of flexible cables 120-2 and 140-2, respectively, are aligned in a direction parallel to plane P2, thereby facilitating reliable, resonance-free and low-signal reflection coupling when connector apparatus 150-2 is manipulated to apply opposing forces F1 and F2. In addition, creating small enough interface artifacts requires the use of very small conductive interface members, because the signal wavelengths at 40 Gbps are of the order of a millimeter. According to a first series of specific embodiments (described below), such interface members are implemented using special spring structures that are either formed on or attached to flexible cables 120 and 140, or formed on or attached to a contact structure that provides a conductive path between associated conductors provided on flexible cables 120 and 140. Embodiments utilizing other interface members are also disclosed below.

FIGS. 3(A) and 3(B) are simplified perspective views respectively showing a surface microstrip-type flexible flat cable 310 and a stripline-type flexible flat cable 320, which represent two types of flexible flat cable utilized to form flexible cables 120 and 140 (discussed above). Note that other flexible flat cables may be utilized (e.g., coplanar wave guide flat cables), and that the specific structures associated with microstrip-type flexible flat cable 310 and stripline-type flexible flat cable 320 are intended to be exemplary (e.g., these structures may be modified to include ground lines in a manner consistent with coplanar wave guide flat cables), and not intended to limit the appended claims unless otherwise specified.

Referring to FIG. 3(A), surface microstrip-type flexible flat cable 310 includes a ground plane (e.g., copper or other conductor) 312, a layer of insulating or dielectric material 314, and a series of conductors (a.k.a., signal traces) 315 that are spaced apart and extend along an upper surface of the insulating/dielectric material 314. Each conductor 315 defines a longitudinal axis (e.g., conductor 315-1 defines a longitudinal axis $X_{315\text{-}1}$) that is substantially parallel to all other conductors 315. Surface microstrips, such as those indicated in FIG. 3(A), are easier to implement and have lower losses because part of the EM fields ride in air. However, the EM fields in the dielectric and those in air propagate at two different velocities, which could cause signal distortion. Also, surface microstrips show substantially more pair-to-pair cross talk. Microstrips may thus only be useful for shorter distances.

Referring to FIG. 3(B), stripline-type flexible flat cable 320 includes upper and lower ground planes 321 and 322, upper and lower layers of insulating material 323 and 324, a series of conductors 325 that are sandwiched between the insulating layers along with a suitable layer of adhesive 326. Each conductor 325 defines a longitudinal axis (e.g., conductor 325-1 defines a longitudinal axis $X_{325-1}$) that is substantially parallel to all other conductors 325. The stack is laminated together under pressure and temperature, and adhesive 326 melts and oozes out in between conductors 325, resulting in an almost perfectly symmetric cross-section. The thickness of adhesive 326 remaining on the top of the stripline traces can be as small/as 7.5 μm. Note that stripline-type flexible flat cable 320 can be manufactured by securing upper insulating layer 323 and upper ground plane 321 onto a microstrip cable (described above). An advantage to using stripline-type flexible flat cable 320 over surface microstrip-type flexible flat cable 310 are lower signal distortion because of the top/down symmetry, lower cross talk and the possibility to stack multiple striplines on top of each other for higher signal density.

FIGS. 4(A) and 4(B) are simplified cross-sectional side views depicting backplane structures incorporating flat cables in accordance with alternative embodiments of the present invention. FIG. 4(A) shows a first backplane 110A in which flexible cable layers 420A are secured to a surface of a rigid circuit board structure 410, and includes flexible cable portions 120 extending therefrom. Referring to FIG. 4(B), a second backplane 110B includes flexible cable layers 420B sandwiched between rigid circuit board structures 412 and 414 using conventional flex-rigid PC board technology, with cable portions 120 extending through special openings 416 defined in circuit board structure 414. This hybrid structure then provides distribution of power and slow signals transmitted on circuit board layers 410 (FIG. 4(A)) or 412 and 414 (FIG. 4(B)), and distribution of the fast digital data runs on the impedance controlled flexible cable portions disposed in flexible cable layer 420A (FIG. 4(A)) or 420B (FIG. 4(B)).

FIG. 5 is a perspective view showing an exemplary line-card 130A including a flexible cable layer 540 at least partially sandwiched between opposing rigid circuit board structures 532 and 534 using conventional flex-rigid PC board technology, with cable portion 140 extending from edges 137 of circuit board structures 532 and 534. Extending flexible cable layer 540 over the entire inner surface of circuit board structures 532 and 534 has the advantage of providing low-loss routing for the fastest board signals.

Figure 6A:
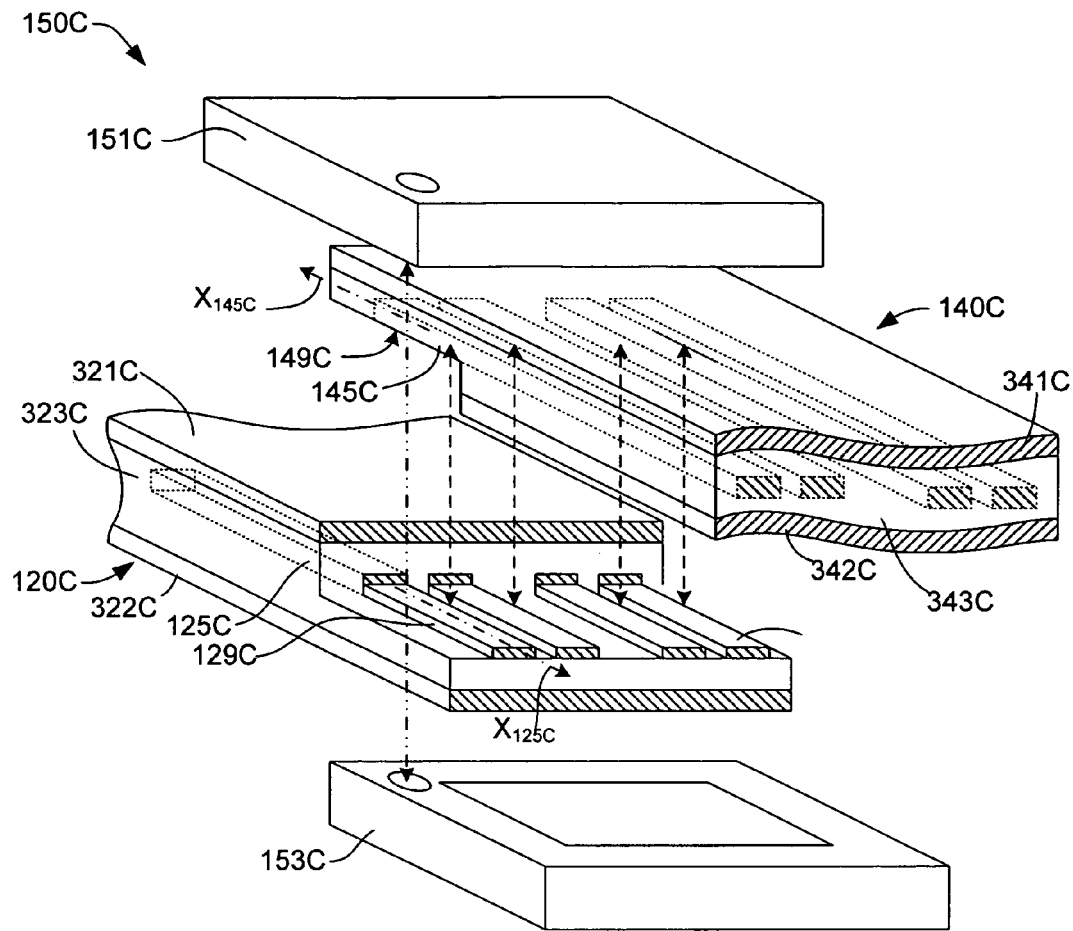
FIGS. 6(A) and 6(B) are exploded perspective and cross-sectional side views showing a simplified connector apparatus and associated flexible cables utilized in the interconnect assembly of FIG. 1.
Figure 6B:
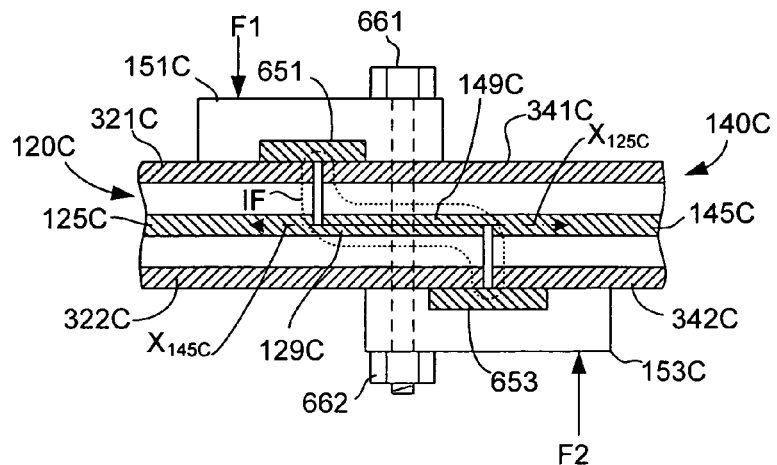

FIGS. 6(A) and 6(B) are exploded perspective and cross-sectional side views depicting a simplified connector apparatus 150C, which is formed by upper contact structure 151C and lower contact structure 153C, along with corresponding portions of flexible cables 120C and 140C, according to an embodiment of the present invention.

Referring to FIG. 6(A), flexible cable 120C is a stripline-type flexible flat cable similar to that described above with reference to FIG. 3(B), and includes a upper ground plane 321C, a lower ground plane 322C, and several parallel conductors, which include conductor 125C, extending in a dielectric layer 323C between the ground planes. A portion of upper ground plane 321C and dielectric layer 323C is stripped away to expose a tip portion 129C of conductor 125C, which is aligned in a direction $X_{125C}$. Similarly, flexible cable 140C includes a upper ground plane 341C, a lower ground plane 342C, and several parallel conductors including conductor 145C that are housed in a dielectric layer 343C between the ground planes. Similar to flexible cable 120C, a portion of lower ground plane 342C and dielectric layer 343C is stripped away to expose a tip portion 149C of conductor 145C, which is aligned in a direction $X_{145C}$.

FIG. 6(B) depicts flexible cables 120C and 140C detachably coupled by contact structures 151C and 153C such that tip (free end) 129C of conductor 125C is aligned with and electrically connected tip 149C of conductor 145C (i.e., such that axes $X_{125C}$ and $X_{145C}$ are substantially collinear), and tip 129C contacts tip 149C to facilitate signal transmissions between a backplane (not shown) connected to flexible cable 120C and a line-card (not shown) connected to flexible cable 140C, thereby forming an interface IF. A suitable fastening device is utilized to apply forces F1 and F2 against flexible cables 120C and 140C, such as a bolt 661 that extends through holes formed in contact structures 151C and 153C and is fastened by a nut 662. An optional bridge conductor 651 is provided on the inside surface of contact structure 151C to electrically connect upper ground planes 321C and 341C, and an optional bridge conductor 653 is provided on contact structure 153C to electrically connect lower ground planes 322C and 342C.

FIGS. 7(A) and 7(B) are perspective and cross-sectional side views showing portions of an interconnect assembly 100D according to a specific embodiment of the present invention. In particular, FIGS. 7(A) and 7(B) show portions of a first flexible cable 120D and a second flexible cable 140D. It is understood that flexible cables 120D and 140D are respectively connected to backplane and line-card circuit boards (not shown) in the manner described above. In addition, similar to the embodiments described above, first flexible cable 120D includes conductors 125D, each having an exposed (tip) portion 129D located adjacent to a free end 123D of flexible cable 120D, and second flexible cable 140D includes conductors 145D, each having exposed (tip) portions 149D located adjacent to free end 143D of flexible cable 140D. Finally, as indicated in FIG. 7(B), a connector structure, which is generally indicated by a first portion 151D and a second portion 153D, is utilized to secure first flexible cable 120D to second flexible cable 140D in the manner described below.

In accordance with an aspect of the present invention, several conductive micro spring fingers 720, which are interface members that are fabricated in the manner described below, are provided on cable 120D to produce an interface arrangement that is low resistance (i.e., less than 1Ω, and more preferably less than 50 mΩ), mechanically compliant to absorb conductor height variations, mechanically tolerant (i.e., resistant to shock and vibration-induced damage), and which provides redundant contact points between conductors 125D and 145D. In addition, by positioning micro spring fingers 720 on the exposed portion 129D and by accurately aligning and mating this portion 129D to the corresponding portion 149D, the present embodiment facilitates highly efficient signal transfer between flexible cables 120D and 140D by providing an interconnect assembly that maintains a uniform impedance and EM field distribution with respect to the signal and ground conductors throughout the connector-cable interfaces with artifacts that only occur in regions that are smaller (narrower) than a fraction of the signal wavelength. More specifically, detailed finite element modeling demonstrated that the microspring fingers 720 should be spaced apart in the direction of the wave propagation by no more than a fifth of the signal wavelength (i.e., with a tip-to-tip spacing S1 as shown in FIG. 7(B)). Although indicated with the microspring fingers bent for illustrative purposes, the mating portions 129D and 149D are preferably fully compressed against each other with the microsprings rolled out flat, leaving no air gap in between. The finite element modeling showed that an air layer S2 (FIG. 7(B)) that is thinner than $\frac{1}{50}^{th}$ of a signal wavelength is acceptable. A maximum gap S3 of $\frac{1}{25}^{th}$ between the butting cable ends in the direction of the wave propagation was also found acceptable. The latter corresponds to about 100 µm at 50 GHz indicating that the cable ends can be trimmed by conventional flex circuit manufacturing techniques. The acceptability criterion used to determine the above margins was a maximal artifact of 1 dB in the $S_{12}$ transfer characteristic and the $S_{11}$ reflection characteristic.

As indicated in FIG. 7(B), conductive micro spring fingers 720 bend away from first cable 120D to facilitate reliable contact with second cable 140D. Each micro spring finger 720 includes an anchor portion 722 and a free portion 725 defining a tip 729. Anchor portion 722 of each micro spring finger 720 is attached to exposed portion 129D of an associated conductor 125D using the methods described below such that anchor 722 extends parallel to the surface of exposed portion 129D (i.e., parallel to axis $X_{125D}$). Free portion 725 of each micro spring finger extends from anchor portion 722, and is "released" (detached) from the associated conductor 125D (i.e., not adhered or otherwise secured, but may be in contact). As described in detail below, micro spring fingers 720 are produced such that an internal stress gradient that biases free portions 725 away from flexible cable 120D, thereby producing the indicated curved shape that points tips 729 in a direction away from exposed portion 129D of conductor 125D. As depicted in FIG. 7(B), when second cable 140D is positioned over and pressed against first flexible cable 120D (e.g., by forces F1 and F2 respectively exerted by connector structure portions 151D and 153D), tips 729 contact exposed portions 149D of flexible cable 140D, thereby providing a multi-contact interface arrangement that facilitates reliable signal transmissions between conductors 125D and 145D.

FIGS. 8(A) through 8(G) and 9 show a method for producing a micro spring finger 720 on exposed portion 129D according to an embodiment of the present invention.

Referring to FIG. 8(A), the fabrication process begins by forming a release layer 810 on exposed conductor portion 129D. In one embodiment, release layer 810 includes titanium (Ti) that is deposited onto exposed portion 129D. As described below, the release material is selected such that the micro spring finger remains connected via a portion of release material layer 810 to exposed portion 129D after release. In an alternative embodiment, a separate anchor pad is separately formed adjacent to the release material that serves to connect the micro spring finger to exposed portion 129D. While such a separately formed anchor pad may increase the strength of the micro spring finger connection, the formation of such an anchor pad would increase the number of process steps, thereby increasing the total manufacturing cost.

Next, as shown in FIG. 8(B), a stress-engineered (spring) film 820 is formed on release layer 810 using known processing techniques such that film 820 includes internal stress variations in the growth direction. For example, in one embodiment, spring material film 820 is formed such that its lowermost portions (i.e., adjacent to release material layer 810) has a higher internal compressive stress than its upper portions, thereby forming internal stress variations that cause a bending bias away from exposed conductor portion 129D. Methods for generating such internal stress variations in spring material film 820 are taught, for example, in U.S.

Pat. No. 3,842,189 (depositing two metals having different internal stresses) and U.S. Pat. No. 5,613,861 (e.g., single metal sputtered while varying process parameters), both of which being incorporated herein by reference. In one embodiment, stress-engineered spring material film 820 includes one or more metals suitable for forming a micro spring finger (e.g., one or more of molybdenum (Mo), a "moly-chrome" alloy (MoCr), tungsten (W), a titanium-tungsten alloy (Ti:W), chromium (Cr), and nickel (Ni)). In other embodiments, spring material film 820 is formed using Si, nitride, oxide, carbide, or diamond that is subsequently coated with a conductive material (e.g., Au (gold)). The thickness of spring material film 820 is determined in part by the selected spring material, an applied coating (when used), and the desired spring constant and shape of the final micro spring finger.

Referring to FIG. 8(C) and FIG. 9, elongated spring masks 830 (e.g., photoresist) are then patterned over selected portions of spring material film 820. Note that each spring mask 830 is formed in the shape of the desired micro spring finger, and may include a pointed tip 835 at one end, as shown in FIG. 9. Note that a base portion 837 of mask 830 that is used to form the fixed (anchor) portion of the micro spring finger is depicted as being rectangular, but can have any selected shape (e.g., V-shape, U-shaped, J-shaped, L-shaped, etc.) or may not be required at all depending on the adhesion properties of the materials used. The fixed end of the subsequently formed micro spring finger may thus be formed wider than the released (cantilevered) free section.

Next, as indicated in FIG. 8(D), exposed portions of spring material film 820 surrounding spring mask 830 are etched using one or more etchants 840 to form a spring island 820-1. In one embodiment this etching process is performed such that limited etching occurs in release layer 810 surrounding spring material island 820-1. The etching step may be performed using, for example, a wet etching process to remove exposed portions of spring material film 820. This embodiment was successfully performed using cerric ammonium nitrate solution to remove a MoCr spring metal layer. In another embodiment, anisotropic dry etching is used to etch both spring material film 820 and the upper surface of release layer portion 810B. This embodiment may be performed, for example, with Mo spring metal and Ti release layers. Mo and Ti both etch in reactive fluorine plasmas. An advantage of dry etching the spring material film is that it facilitates finer features and sharper tipped micro spring fingers. Materials that do not etch in reactive plasmas may still be etched anisotropically by physical ion etching methods, such as Argon ion milling. In yet another possible embodiment, the etching step can be performed using the electro-chemical etching process described in IBM J. Res. Dev. Vol. 42, No. 8, page 655 (Sep. 8, 1998), which is incorporated herein by reference. Moreover, the contacts may be plated, for example, U.S. Pat. No. 6,528,350, which is incorporated herein by reference. Many additional process variations and material substitutions are therefore possible and the examples given are not intended to be limiting.

FIG. 8(E) shows spring material island 820-1 and release material 810 after spring mask 830 (FIG. 8(D)) is removed.

Next, as shown in FIG. 8(F), a release mask 850 is formed on a first portion 820-1A of spring island 820-1. Release mask 850 defines a release window RW, which exposes a second portion 820-1B of spring material island 820-1 and surrounding portions release material layer 810. Release mask 850 may also serve as a strapping structure to further secure first portion 820-1A (i.e., anchor portion 722; see FIG. 7(B)) to exposed conductor 129D. In one embodiment, release mask 850 is formed using photoresist. In other embodiments, a suitable metal or epoxy may be used.

Finally, as indicated in FIG. 8(G), a release etchant 870 (e.g., a buffered oxide etch) is then use to selectively remove a portion of the release material layer from beneath the exposed portion of the spring material island to form micro spring finger 720. Specifically, removal of the exposed release material causes free portion 725 to bend away from exposed conductor 129D due to the internal stress variations established during the formation of the spring material film (discussed above). Note that anchor portion 722 remains secured to exposed conductor 129D by release material (support) portion 810A, which is protected by release mask 850. Note also that resist mask 850 may be optionally removed from anchor portion 722 of micro spring finger 720 after release. Finally, although not specifically shown, a conductive plated metal may be formed/deposited on each contact using known techniques.

FIG. 10 is an enlarged photograph showing an actual micro spring finger 720A that was produced using the fabrication process described above. Anchor portion 722A is attached to the upper surface of exposed conductor 129D. Note that tip 729A of micro spring finger 720A is formed "in-plane" (i.e., etched from or aligned with the stress-engineered spring material layer used to form micro spring finger 720A). The width of cantilevered free portion 725A is approximately 25 μm, and the lift height (i.e., the distance from tip 729 conductor portion 129D) is approximately 100 μm.

From a manufacturing standpoint, integrating micro spring fingers directly onto flexible cable ends, as described in the previous embodiment, requires that the entire flexible cable be put into the associated micro spring finger manufacturing tool (e.g., a sputter tool), and makes the resulting flexible cable very expensive to produce.

An alternative manufacturing method that can be utilized to reduce this high cable cost is to form the spring structures on suitable substrate, dice the substrate into sections, and then secure the sections to the cable ends using a conductive adhesive. However, this approach would require release of the micro spring fingers prior to transfer, which would increase the risk of damage to the micro spring fingers during the transfer process.

Figure 11A:
FIGS. 11(A), 11(B), 11(C), 11(D), 11(E), 11(F), 11(G), and 11(H) are simplified cross-sectional side views showing a method for producing an apparatus including a micro spring finger according to another embodiment of the present invention.
Figure 11B:
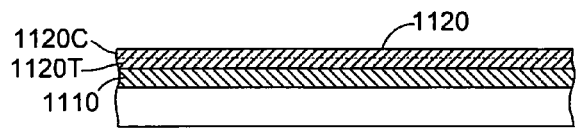
Figure 11C:
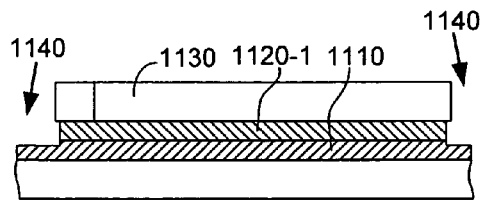
Figure 11D:
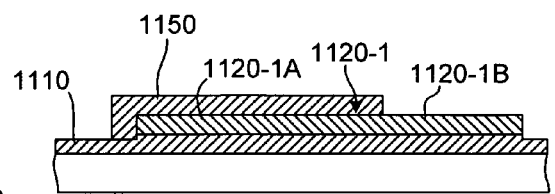
Figure 11E:
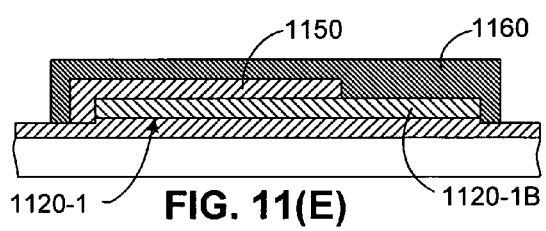
Figure 11F:
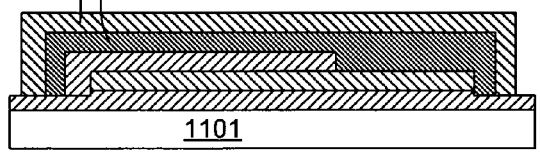
Figure 11G:
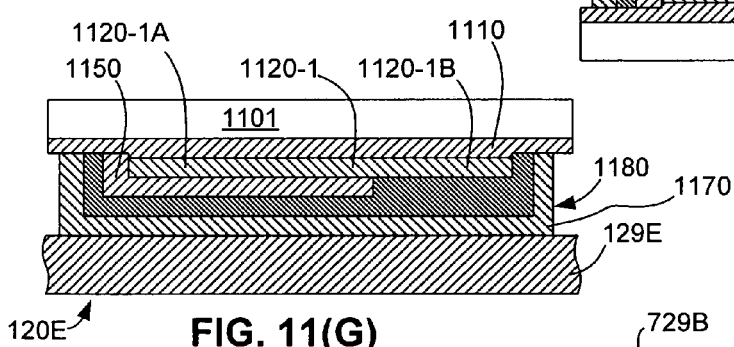
Figure 11H:
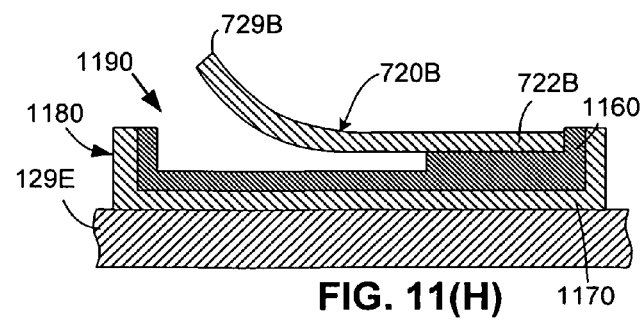

FIGS. 11(A) 11(H) are simplified cross-sectional side views showing a method for producing a flexible cable having a spring finger mounted thereon according to another embodiment of the present invention. While the novel production method is described with reference to flexible cables, it is noted that this method may be utilized to produce a wide range of apparatus having spring fingers formed thereon.

Referring to FIGS. 11(A), the method begins by forming (e.g., sputtering) a release material layer 1110 (e.g., Ti) on a substrate 1101. Note that substrate 1101 is ultimately discarded, and therefore can be formed using non-conductive materials.

Subsequently, as shown in FIGS. 11(B) and 11(C), a stressed spring island 1120-1 is formed by depositing a spring material layer 1120 (e.g., MoCr) onto release layer 1110, and then utilizing a mask 1130 to etch the spring material. Note that, unlike the previously-described spring fabrication methods (i.e., as described with reference to FIG. 8(B)), the stress gradient of spring material layer 1120 is formed "upside-down" (i.e., such that a relatively tensile region 1120T is located adjacent release layer 1110, and a relatively compressive region 1120C is located above tensile region 1120T).

Next, as indicated in FIG. 11(D), a (second) release material portion 1150 (e.g., Ti) is patterned over a (first) portion 1120-1A of spring island 1120-1 using known techniques. As indicated below, a second portion 1120-1B of spring material that is not covered by release material portion 1150 serves as the anchor portion in the released micro spring structure.

Referring to FIGS. 11(E) and 11(F), a base structure 1180 is then formed over an exposed (second) portion 1120-1B of spring island 1120-1 and release material portion 1150. As indicated in FIG. 11(E), according to one embodiment, a (Cu)—Ni—Au strip 1160 covering portion 1120-1B and release material portion 1150 is then formed, for example, by sputtering a blanket/seed layer over the expose structures, and then utilizing known electroplating or electroless plating techniques. Note that the use of copper in (Cu)—Ni—Au strip 1160 is optional. Next, as indicated in FIG. 11(F), a solder layer 1170 is formed on (Cu)—Ni—Au strip 1160. In an alternative embodiment (not shown), a resist mask may be used to limit the structure covered by strip 1160 and solder 1170. An optional dicing process (not shown), using known techniques, may then be utilized to separate substrate 1101 into predetermined sections for transfer to an apparatus.

Referring to FIG. 11(G), the substrate is then inverted and mounted onto the surface of an exposed conductor portion 129E of a cable 120E. Base structure 1180 is then secured to exposed conductor portion 129E, for example, by reflowing solder layer 1170 using known techniques. Note that spring metal island 1120-1 is now positioned between exposed cable portion 129E and substrate 1101.

Finally, as shown in FIG. 11(H), the substrate is removed and release material layers are etched using a suitable etchant 1190, thereby releasing the spring island and forming released spring finger 720B. Note that the release procedure is performed after the substrate/spring is mounted on exposed conductor portion 129E, thereby reducing the risk of damage to the release spring finger during the transfer process. Note also that, as shown in FIG. 11(H), released spring finger 720B has an anchor portion 722B (formerly second section 1120-1B; FIG. 11(G)) that is electrically connected to exposed conductor portion 129E by way of a corresponding portion of Au—(Cu)—Ni—Au strip 1160, and by way of solder layer 1170.

Figure 12:
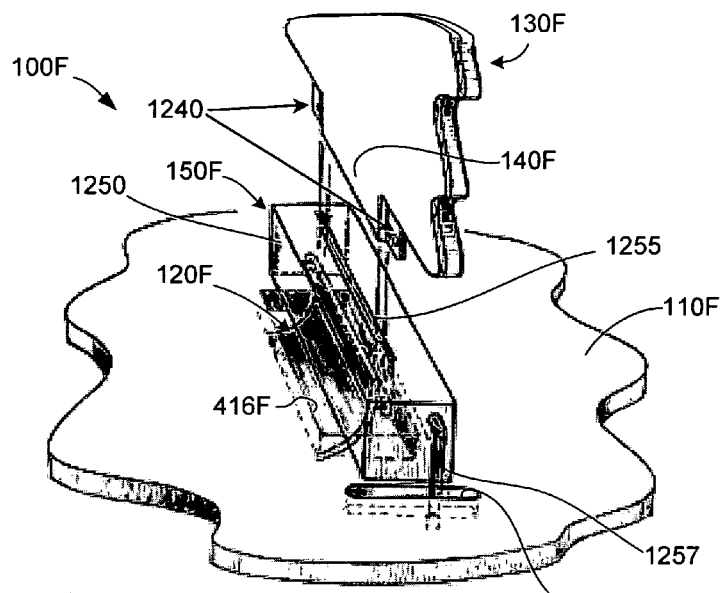
FIG. 12 is a perspective view depicting an interconnect assembly according to yet another embodiment of the present invention.

FIG. 12 is a modified perspective view depicting an interconnect assembly 100F according to yet another embodiment of the present invention. Similar to previous embodiments, interconnect assembly 100F includes a backplane 110F having a flexible cable 120F, a line-card 130F including a flexible cable 140F, and a connector apparatus 150F for detachably coupling flexible cables 120F and 140F. Connector apparatus 150F includes a housing 1250 that is mounted on backplane 110F. As indicated, flexible cable 120F is formed on a lower surface of backplane 110F, has a curved portion that bends upward and extends through an associated opening 416F formed in backplane 110F, and into a lower portion of housing 1250. In contrast to previous embodiments described above, flexible cable 120F is mounted on the underside surface of backplane 110F for additional clearance. Housing 1250 also defines an upper slit 1255 for receiving an end portion of flexible cable 140F when line-card 130F is mounted to backplane 110F. Note that located near the end portion of flexible cable 140 is an alignment structure 1240 (e.g., flanges defining alignment holes). As discussed below, alignment structure 1240, along with a corresponding alignment structure formed on flexible cable 120F, are utilized to precisely align flexible cables 120F and 140F during the cable coupling process. Finally, an optional actuation lever 1257 extends from housing 1250 and through a slit 1212 formed in backplane 110F. Actuating lever 1257 is mechanically connected to mechanisms located inside housing that manipulate corresponding connection structures to detachably couple conductors formed on flexible cables 120F and 140F in the manner described below. In another embodiment (not shown), actuating lever 1257 may be replaced with an actuating mechanism having a knob, screw, or lever mounted on a front panel of the (e.g., router) cabinet.

Figures 13A, 13B, 13C:
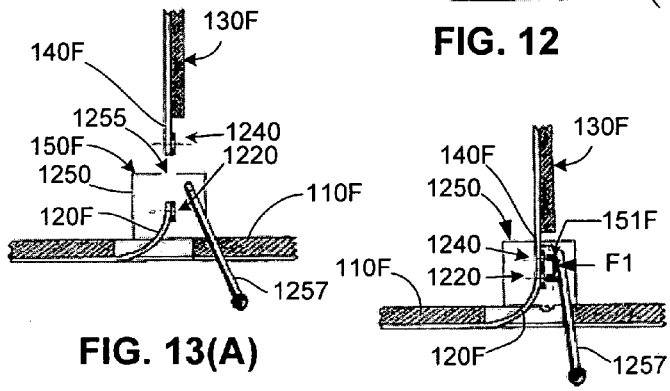
FIGS. 13(A), 13(B), and 13(C) are cross-sectional side views showing the interconnect assembly of FIG. 12 during a cable coupling process utilizing a connection apparatus according to another embodiment of the present invention.
Figure 14A:
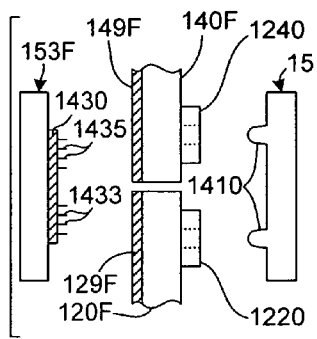
FIGS. 14(A), 14(B), and 14(C) are enlarged side views showing the cable coupling process of FIGS.
Figure 14B:
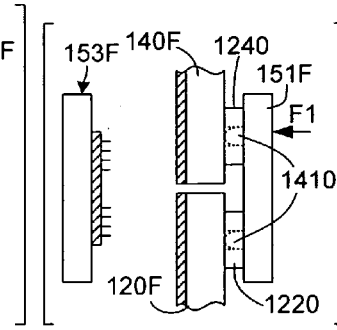
Figure 14C:
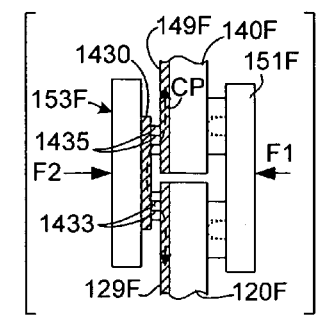

FIGS. 13(A), 13(B), and 13(C) are cross-sectional side views showing a cable coupling process performed by connector apparatus 150F according to another embodiment of the present invention, and FIGS. 14(A), 14(B), and 14(C) are enlarged side views showing portions of connector apparatus 150F during the cable coupling process.

Referring to FIG. 13(A), during a first stage of the coupling process, line-card 130F is manually moved toward backplane 110F such that an end of flexible cable 140F is inserted through slit 1255, and such that both sets of alignment structures 1220 and 1240 are positioned inside of housing 1250. Note that positioning structures, such as guide slots (not shown), are provided inside housing 1250 to facilitate rough positioning of cables 120F and 140F.

Referring to FIG. 14(A), while the end of flexible cable 140 is being inserted into the housing, lever 1257 (FIG. 13(A)) is in a first position that causes a cam mechanism (not shown) to maintain a first contact structure 153F and a second contact structure (alignment plate) 151F away from the ends of flexible cables 120F and 140F. Contact structure 151F includes several dowels 1410 that extend toward alignment structures 1220 and 1240. Contact structure 153F includes a conductive strip 1430, a first set of conductive interface members 1433 protruding from a first region of conductive strip 1430, and a second plurality of conductive interface members 1435 protruding from a second region of conductive strip 1430. Note that, when the flexible cables contain more than one parallel conductor, multiple parallel conductive strips is arranged in a manner similar to the conductor segments 125D (see FIG. 7(A)).

Referring to FIG. 13(B), once line-card 130F is roughly positioned relative to backplane 110F, lever 1257 is manipulated into a first position, thereby causing a cam mechanism (not shown) to apply a force F1 against contact structure 151F, thus moving contact structure 151F toward alignment structures 1220 and 1240. As indicated in FIG. 14(B), when flexible cables 120F and 140F are properly aligned, this movement of contact structure 151F causes dowels 1410 to enter holes formed in alignment structures 1220 and 1240, thereby securing the ends of flexible cables 120F and 140F in a predetermined relative position (i.e., such that exposed portions 129F and 149F are in an optimal position for contact by contact structure 151F).

Referring to FIG. 13(C) and FIG. 14(C), once flexible cables 120F and 140F are secured in a predetermined position (e.g., as indicated in FIG. 14(C), such that an end portions 129F of a conductor formed on flexible cable 120F is located adjacent to and aligned with an end portions 149F of a conductor formed on flexible cable 140F), lever 1257 is further manipulated to cause the cam mechanism to apply a second force F2, which is opposite to force F1, against contact structure 153F, thus moving contact structure 153F toward flexible cables 120F and 140F. As indicated in FIG. 14(C), contact structure 153F is thus pressed against flexible cables 120F and 140F such that interface members 1433 contact exposed portion 129F of the (first) conductor formed on flexible cable 120F, and interface members 1455 contact exposed portion 149F of the (second) conductor formed on flexible cable 140F, thereby providing an electrical path CP (indicated by double-headed dashed arrow) from conductor portion 129F through interface members 1433 to conductive strip 1430, and from conductive strip 1430 through the interface members 1435 to conductor portion 149F.

Decoupling line-card 130F from backplane 110F involves steps performed in an opposite order to those described above. In particular, contact structures 151F and 153F are retracted from exposed conductor portions 129F and 149F, and then dowels 1410 are retracted from alignment structures 1220 and 1240. Decoupling in this manner prevents damage to interface members 1433 and 1435.

Connector apparatus 150F provides several advantages over the cable-to-cable connection described above. First, contact structure 1430 is typically easier and less expensive to produce than flexible cables with interface members formed or mounted thereon. Second, because contact structure 1430 is located within housing 1250, interface members 1433 and 1435 are protected from damage to a much higher degree than when exposed on the end of a cable. Third, by utilizing the cam mechanism described above, prevents flexible cable 120F from being coupled and/or decoupled from flexible cable 140F while the interface members are exposed to damage. This is particularly important when interface members 1433 and 1435 are implemented using the spring fingers, described above, which are rather fragile.

According to another aspect of the present invention, contact structures 151F and 153F are constructed such that they are thermally matched with flexible cables 120F and 140F to avoid failures caused by thermally induced misalignment. In one embodiment, each conductor strip 1430 is formed using the same materials (e.g., copper) and has the same width and thickness as the conductors provided on cables 120F and 140F.

The description of connector apparatus 150F, provided above, is greatly simplified for descriptive purposes in that flexible cables 120F and 140F are depicted to respectively include a single conductor. As described above, high-speed transmissions are greatly enhanced by the use of surface microstrip and stripline flat cable technologies, which include one or more ground plane structures, and which may include more than one layer of conductors, with each layer including multiple conductors. The following specific embodiments describe contact structures having features that facilitate high-speed signal transmissions on a variety of flexible cable structures.

Figure 15A:
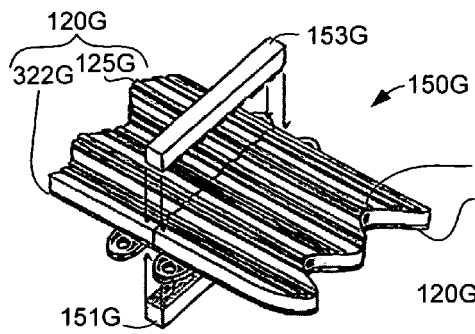
FIGS. 15(A) and 15(B) are perspective and cross-sectional side views, respectively, showing portions of a connector apparatus according to a specific embodiment of the present invention.
Figure 15B:
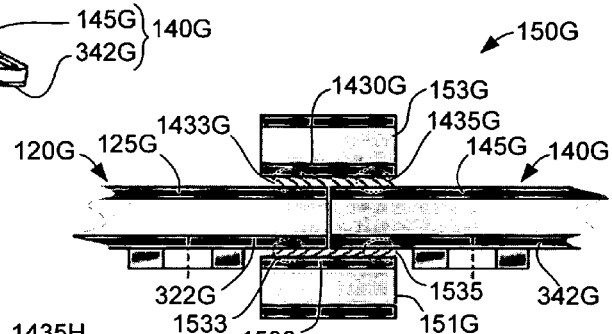

FIGS. 15(A) and 15(B) are perspective and cross-sectional side views, respectively, showing portions of a connector apparatus 150G in which a first surface microstrip-type flat cable 120G (discussed above with reference to FIG. 3(A)) is coupled to a second surface microstrip-type flat cable 140G using a contact structure 151G and a contact structure 153G positioned on opposite sides of the flexible cables. As indicated in FIG. 15(A), flexible cable 120G includes a ground plane 322G (e.g., a copper layer) and a series of conductors 125G, and flexible cable 140G includes a ground plane 342G and a series of conductors 145G. As indicated in FIG. 15(B), contact structure 153G includes a conductive strip 1430G, and first and second sets of interface members 1433G and 1435G protruding from conductive strip 1430G, and are arranged to facilitate signal transmissions between conductor 125G and conductor 145G in the manner described above. Similarly, contact structure 151G includes a conductive strip 1530, and first and second sets of interface members 1533 and 1535 protruding therefrom, and are disposed to connect ground planes 322G and 342G. In one embodiment, interface members 1533 and 1535 are identical to the high-speed interface members 1433G and 1435G (e.g., spring fingers produced in the manner described above).

Figure 16:
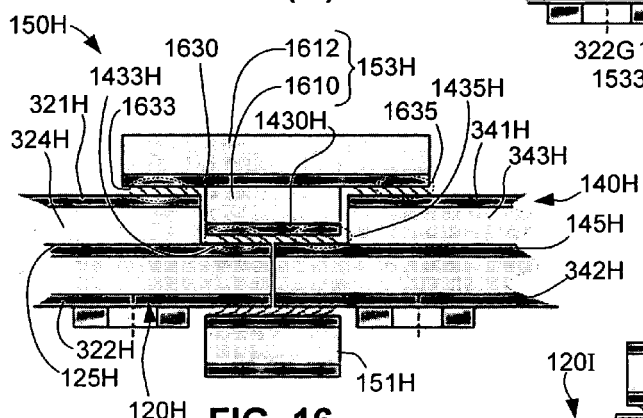
FIG. 16 is a cross-sectional side view showing portions of a connector apparatus according to another specific embodiment of the present invention.

FIG. 16 is a cross-sectional side view showing portions of a connector apparatus 150H in which a first surface stripline-type flat cable 120H (discussed above with reference to FIG. 3(B)) is coupled to a second stripline-type flat cable 140H using a contact structure 151H and a contact structure 153H positioned on opposite sides of the flexible cables. Cables 120H and 140H are modified to include a notch (opening) through upper ground planes 321H and 341H, and through upper insulating layers 324H and 344H to expose their respective tips of conductors 120H and 140H. Contact structure 151H is constructed and functions in a manner similar to that described above with reference to contact structure 151G. However, contact structure 153H includes a first portion 1610 that extends through the notch formed at the leading edges of cables 120H and 140H, and a second portion 1612 that is located above first portion 1610. First portion 1610 is arranged and operates essentially in the manner described above with reference to contact structure 153G (i.e., conductive strip 1430H and interface member sets 1433H and 1435H facilitate current flow between conductors 125H and 145H). Second portion 1612 includes a (third) conductive strip 1630 that extends across the top of first portion 1610, a (fifth) set of interface members 1633 extending between conductive strip 1630 and ground plane 321H, and a (sixth) set of interface members 1635 extending between conductive strip 1630 and a portion of ground plane 341H, thereby electrically coupling ground planes 321H and 341H.

Figure 17:
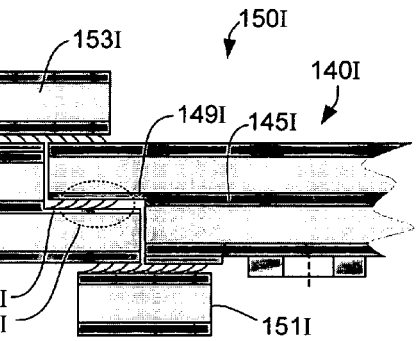
FIG. 17 is a cross-sectional side view showing portions of a connector apparatus according to another specific embodiment of the present invention.

FIG. 17 is a cross-sectional side view showing portions of a connector apparatus 150I according to yet another specific embodiment of the present invention. Connector apparatus 150I utilizes three-layer stripline-type cables 120I and 140I, and contact structures 151I and 153I. Similar to the arrangement described above with reference to FIGS. 7(A) and 7(B), cable 120I includes interface members 720I that provide electrical connection between exposed conductor tips 129I and 149I of conductors 125I and 145I, respectively. Note that, in this arrangement, the function of both contact structures 151I and 153I is to connect the respective upper and lower ground planes. However, as discussed above, this arrangement may be impractical due to the cost of providing interface members on the end of cable 120I.

The specific embodiments presented above with reference to FIG. 15(A) through FIG. 17 are similar in that they use two contact structures to make all of the necessary ground and signal connections. Although this approach is practical in many instances, facilitating all of these connections using a single contact structure may provide a cheaper and more reliable connector apparatus. Several exemplary single-contactor embodiments are presented in the following paragraphs. It is noted these embodiments require an alignment plate (e.g., similar to that discussed above with reference to FIGS. 13 and 14), which is omitted from the following description for brevity.

Figure 18A:
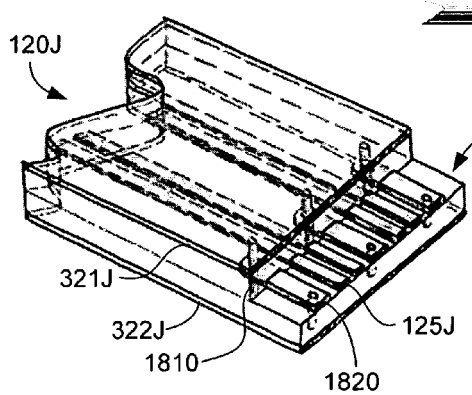
FIGS. 18(A) and 18(B) respectively show a perspective of a modified cable, and a cross-sectional side view of a connector apparatus utilizing the modified cable according to another specific embodiment of the present invention.
Figure 18B:
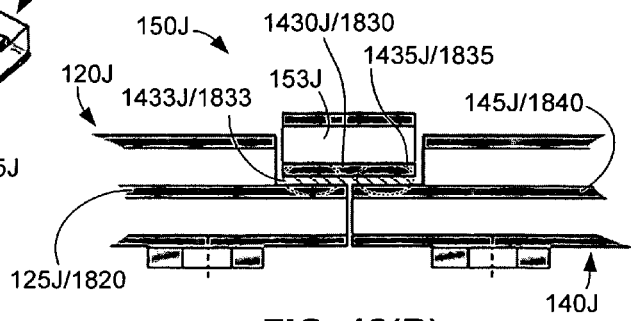

FIGS. 18(A) and 18(B) respectively show a perspective of a modified stripline-type cables 120J, and a cross-sectional side view of a connector apparatus 150J for connecting cable 120J to an identical cable 140J according to another specific embodiment of the present invention. As indicated in FIG. 18(A), flexible flat cable 120J includes an upper (second) ground plane 321J, a lower (first) ground plane 322J, and several conductors 125J extending in an insulating layer sandwiched between these ground planes. Located adjacent to free end 123J of cable 120J is a series of conductive via structures 1810 that extend between ground planes 321J and 322J, and several elongated conductive strips 1820 connected to respective conductive via structures 1810. Each elongated conductive strips 1820 is aligned in parallel to conductors 125J, thereby providing contact points for both the ground planes and the conductors on a single, coplanar region of cable 120J. As indicated in FIG. 18(B), this cable arrangement greatly simplifies connector apparatus 150J in that all ground and signal connections are implemented by a single contactor 153J that includes both a first set of conductive strips 1430J and interface members 1433J and 1435J, and a second set of conductive strips 1830 and interface members 1833 and 1835 that are arranged in parallel. This cable arrangement simplifies the connector apparatus mechanism, but may require some re-orienting of the electrical and magnetic fields as the signal waves cross the interface and thus may cause some signal reflection.

Figure 19:
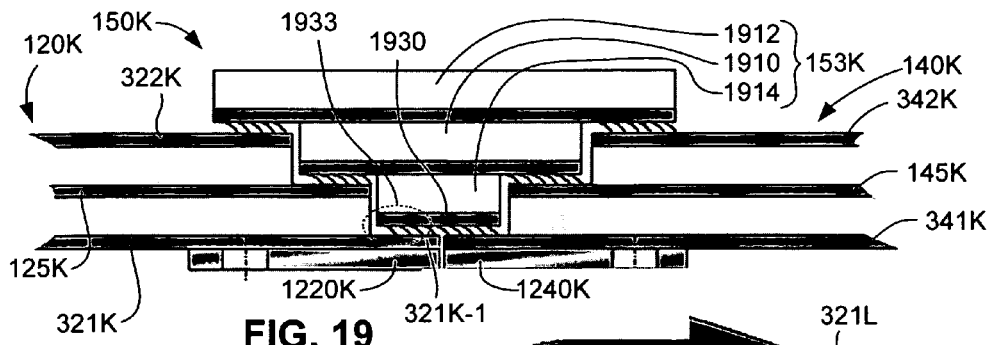
FIG. 19 is a cross-sectional side view showing portions of a connector apparatus according to another specific embodiment of the present invention.

Another single contact structure connector apparatus 150K is shown in FIG. 19. Connector apparatus 150K is utilized with modified flexible flat cables 120K and 140K that include elongated alignment (support) support structure 1220K and 1240K, each supporting a corresponding exposed portion of lower ground planes 321K and 341K (e.g., thin copper foil), respectively. Contact structure 153K includes three portions: a first portion 1910 that functions as described above to couple conductors 125K and 145K, a second portion 1912 mounted over first portion 1910 and disposed to couple ground planes 322K and 342K, and a third portion 1914 extending below first portion 1910. Third portion 1914 includes a conductive strip 1930 and interface members 1933 extending between conductive strip 1930 and the exposed portion of ground plane 321K, and interface members extending between conductive strip 1930 and the exposed portion of ground plane 341K. Similar to the embodiment described above with reference to FIG. 18(B), the arrangement shown in FIG. 19 simplifies the connector apparatus mechanism, and may avoid the re-orientation issues discussed with reference to FIG. 18(B).

While single layer microstrip and stripline flexible flat cables provide a suitable number of conductors for many communication systems, multi-layered stripline cables are sometimes used to facilitate higher signal densities, thereby further increasing data transmission rates, or providing transmission redundancies and/or the same data transmission speeds at lower frequencies.

Figure 20:
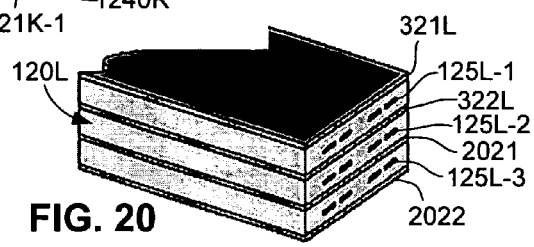
FIG. 20 is a perspective showing a multi-layered flexible cable.

FIG. 20 is a perspective view showing an exemplary multi-level stripline cable 120L that can be used in the various assemblies described above in place of single layer microstrip and stripline cables. Note that multi-level stripline cable 120L is essentially several single layer stripline structures that are laminated together to provide a first layer of conductors (i.e., including conductor 125L-1 located between ground planes 321L and 322L, a second layer of conductors (i.e., including conductor 125L-2 located between ground planes 322L and 2021, and a third layer of conductors (i.e., including conductor 125L-3 located between ground planes 2021 and 2022. Note also that the first conductor layer and the second conductor layer share ground plane 322L, and the second conductor layer and the third conductor layer share ground plane 2021.

Figure 21:
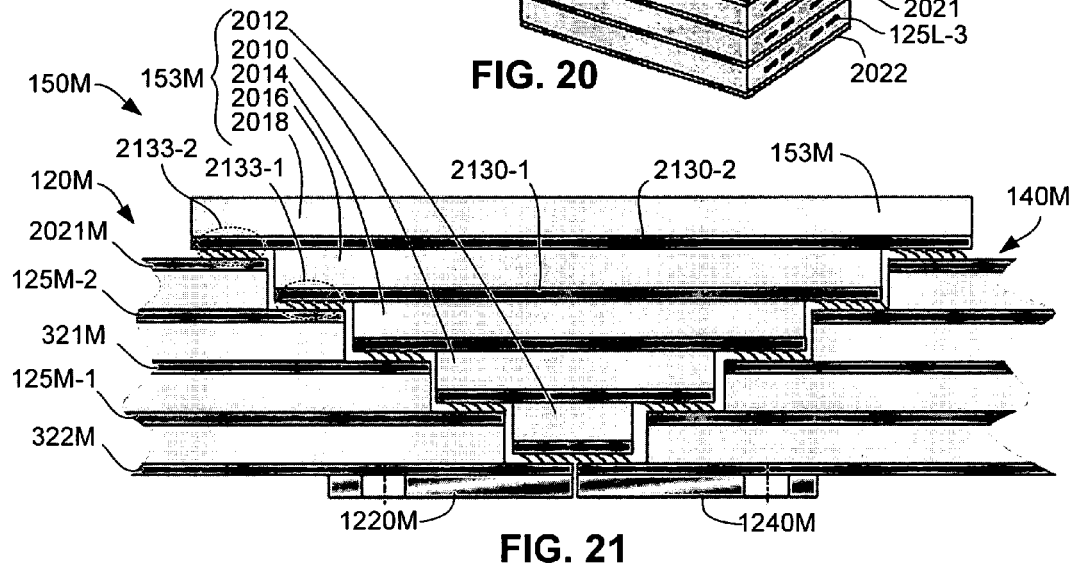
FIG. 21 is a cross-sectional side views showing portions of connector apparatus for connecting multi-layered flexible cables according to another specific embodiment of the present invention.

FIG. 21 is a simplified cross-sectional side view showing an exemplary connector apparatus 150M utilizing a single contact structure 153M to connect multi-level stripline cables 120M and 140M. Note that stripline cables 120M and 140M are modified in a manner similar to that described above with reference to FIG. 19 (i.e., using elongated alignment structures 1220M and 1230M to support exposed portions of the lowermost ground plane). Referring to the left side of FIG. 21, a first conductor 125M-1, a central ground plane 321M, and lower ground plane 322M of cable 120M are respectively contacted by a first portion 2010, second portion 2012, and third portion 2014 of contact structure 153M in a manner similar to that described above with reference to FIG. 19. In addition, contact structure 153M includes a fourth portion 2016 mounted over third portion 2014, and a fifth portion 2018 mounted over the fourth portion 2016. Fourth portion 2016 includes a conductive strip 2030-1 and interface members 2033-1 that extend from conductive strip 2030-1 and contact third conductor 125M-2, and fifth portion 2018 includes a conductive strip 2030-2 and interface members 2033-2 that contact upper ground plane 2021M. Similar structures are formed on cable 140M. Accordingly, connector apparatus 150M provides a relatively simple mechanism that can be used to couple the multiple conductor layers and ground planes associated with multi-layer cables 120M and 140M.

Figure 22:
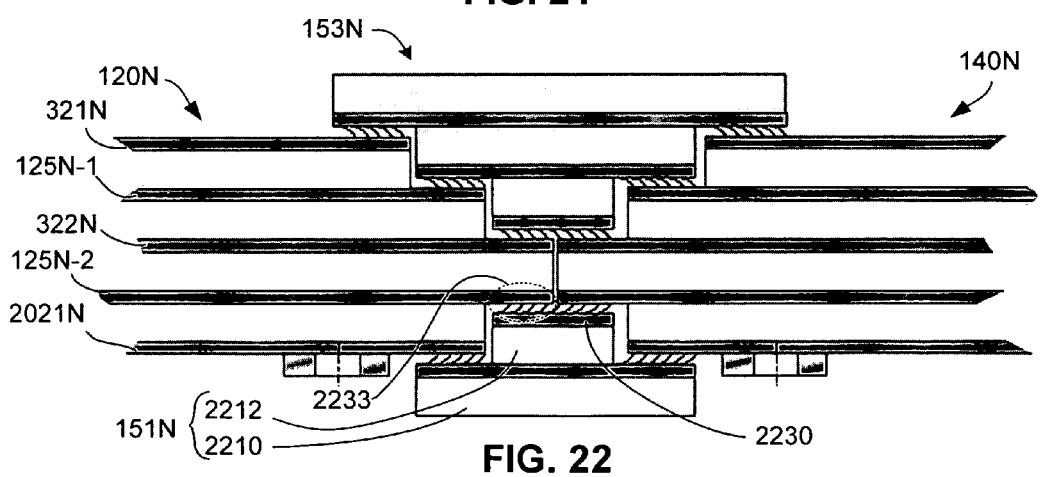
FIG. 22 is a cross-sectional side views showing portions of connector apparatus for connecting multi-layered flexible cables according to another specific embodiment of the present invention.

FIG. 22 is a simplified cross-sectional side view showing an exemplary connector apparatus 150N that utilizes two contact structures 151N and 153N to connect multi-level stripline cables 120N and 140N. Similar to the structure described above with reference to FIG. 19, contact structure 153N is provided to couple the first layer of conductors (e.g., 125N-1), the central ground plane (e.g., ground plane 322N), and the upper ground plane (e.g., ground plane 321N). In addition, second contact structure 151N includes a first portion 2310 that functions as described above to couple the lower ground planes (e.g., ground plane 2021N), and a second portion that includes a conductive strip 2230 and interface members 2233 extending between conductive strip 2230 and third conductor 125N-2.

Although the above specific embodiments are described with reference to spring finger-type interface members for high-speed communications, other structures may provide suitable interface members as well.

Figure 23A:
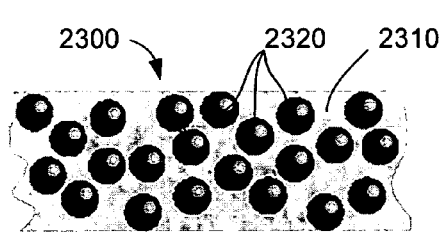
FIGS. 23(A) and 23(B) are cross-sectional side views showing an anisotropic conductive film (ACF or z-axis film) element.
Figure 23B:
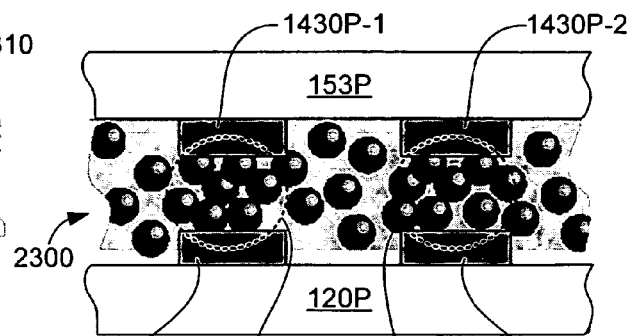

FIG. 23(A) is a simplified cross-sectional side view showing a variable conductive element 2300 commonly referred to as "anisotropic conductive film (ACF)" (also referred to as "z-axis film" or "elastomeric conducting polymer interconnect" (ECPI)), which provides an alternative type of interface member for the various connection apparatus described above. Z-axis film 2300 generally includes a layer of pliable insulating material 2310 having conductive particles (e.g., metal coated polymer balls) 2320 suspended therein. When subjected to normal atmospheric conditions, z-axis film 2300 is generally non-conducting. However, when subjected to pressing forces the pliable film material is compressed, thereby bringing conductive particles 2320 in contact, and producing a conductive region through z-axis film 2300. For example, as indicated in FIG. 23(B), a region pressed between a protruding conductive strip 1430P-1 formed on a contact structure 153P and a conductor 125P-1 formed on a flexible cable 120P forces conductive particles 2320 in contact, thereby producing an effective interface member 1430P-1 that facilitates signal transmissions through z-axis film 2300 between conductive strip 1430P-1 and conductor 125P-1. Similarly, a region pressed between a protruding conductive strip 1430P-2 and a conductor 125P-2 produces an effective interface member 1430P-2 that facilitates signal transmissions between conductive strip 1430P-2 and conductor 125P-2. Note that uncompressed regions between these effective interface members remain non-conducting, thereby preventing cross-talk between adjacent conductors.

Figure 24:
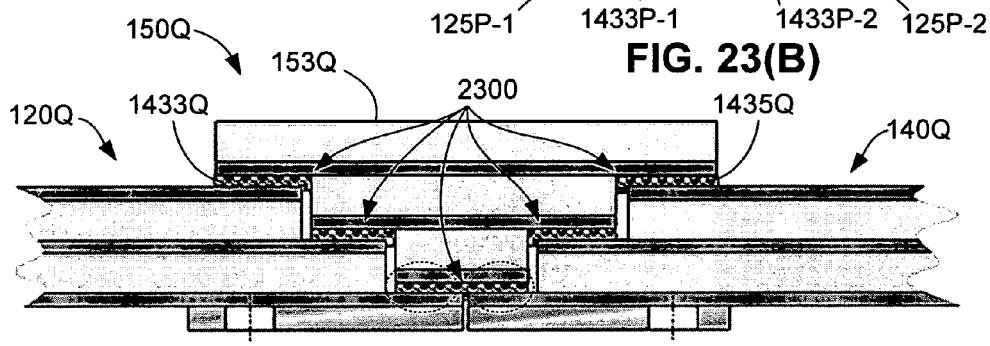
FIG. 24 is a cross-sectional side view showing portions of a connector apparatus utilizing the z-axis film element of FIG. 22(A) according to another embodiment of the present invention.

FIG. 24 is a simplified cross-sectional side view showing an exemplary connector apparatus 150Q that utilizes a single contact structure 153Q to connect stripline cables 120Q and 140Q. Similar to the structure described above with reference to FIG. 19, contact structure 153Q is provided to couple the conductors and ground planes of cables 120Q and 140Q using a three-part structure. However, instead of using spring finger-type interface members, connector apparatus 150Q utilizes z-axis film sections 2300 to facilitate conduction between cable 120Q and associated conductive strips formed on contact structure 153Q (e.g., by way of effective interface member 1433Q), and between these conductive strips and associated portions of cable 140Q (e.g., by way of effective interface member 1435Q).

Figure 25A:
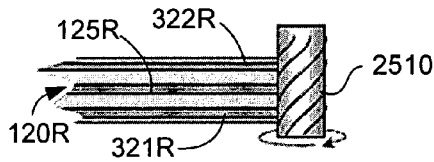
FIGS. 25(A) and 25(B) are cross-sectional side views illustrating a method for preparing a cable according to another embodiment of the present invention.
Figure 25B:
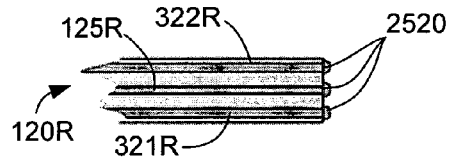
Figure 26:
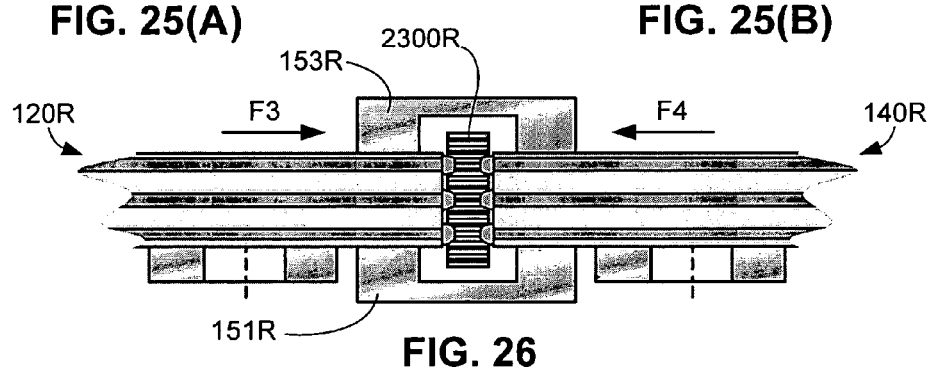
FIG. 26 is a cross-sectional side view showing portions of a connector apparatus utilizing the z-axis film element of FIG. 22(A) and the cables prepared in accordance with FIGS. 25(A) and 25(B) according to yet another embodiment of the present invention.

FIG. 26 is a cross-sectional side view illustrating a connector apparatus 150R according to yet another embodiment of the present invention, and FIGS. 25(A), 25(B) are cross-sectional side views illustrating a method for processing the flexible flat cables for use in apparatus 150R. FIG. 25(A) depicts a process of grinding an end of cable 120R using, for example, a rotary grinding tool 2510 to expose ends of conductors 125R and ground planes 321R and 322R. Subsequently, as indicated in FIG. 25(B), protrusions 2520 are formed on the exposed ends by, for example, plating the exposed ends with a suitable conductive, low corrosion material (e.g., hard gold). The thus-prepared cables are then coupled by connector apparatus 150R as indicted in FIG. 26. As indicated, connector apparatus includes an upper contact structure 153R, a lower contact structure 151R, and a z-axis film element 2300R. The prepared ends of cables 120R and 140R are received and aligned within contact structures 151R and 153R, and are subjected to longitudinal pressing forces F3 and F4 to produce effective interface members in z-axis film element 2300R that provides conduction between matching protrusions formed on cables 120R and 140R. An advantage of this arrangement is that it avoids having to expose the center conductors, and the need for a contact structure using spring finger interface members, as described in the embodiments above.

Figure 27:
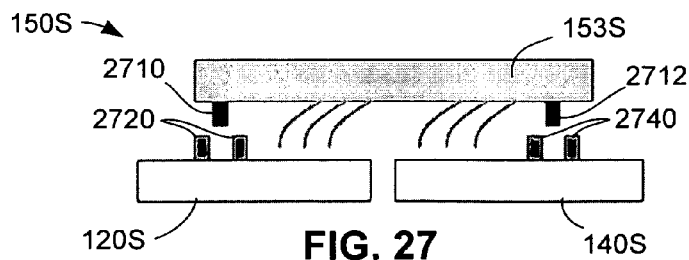
FIG. 27 is a simplified cross-sectional side view showing portions of a connector apparatus incorporating integrated micromachined alignment marks according to another embodiment of the present invention.

FIG. 27 is a simplified cross-sectional side view showing a connector apparatus 150S incorporating micromachined alignment structures according to another embodiment of the present invention. The high-density interface arrangements described above depend on accurate alignment and securing between the flexible cables extending from the associated mating boards. A general alignment structure is described above for positioning the respective cables to facilitate a successful coupling procedure. As indicated in FIG. 27, further x-y alignment accuracy may be obtained by providing micromachined alignment structures 2710 and 2712 on contact structure 153S, and complementary micromachined alignment structures 2720 and 2740 on cables 120S and 140S, respectively. Such micromachined alignment structures can be fabricated during the spring formation process, thereby minimizing additional cost. Note such micromachined alignment structures can also provide accurate alignment in z-axis film-based structures because they can be produced to provide stops, which are important for controlling overdrive and insuring uniform compression, and thus wear of the contacts. In addition, current pressure contacts fretting experiments suggest that multiple touchdowns in the same scrub helps to clear debris and insure glitch-free performance. Precision alignment mechanisms that repeatedly hit the same scrub area would be necessary to make this scrub/tip cleaning technique possible.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. An interconnect assembly for transmitting high-speed signals between circuit structures, the assembly comprising:
    a first flexible flat cable having a first end connected to a first circuit structure and a second end extending from the first circuit structure, wherein the first flexible flat cable includes a first flexible conductor having a free end exposed on the second end of the first flexible flat cable;
    a second flexible flat cable having a first end connected to a second circuit structure and a second end extending from the second circuit structure, the second flexible flat cable including a second flexible conductor having a free end exposed on the second end of the second flexible flat cable; and
    a connector apparatus for detachably coupling the first flexible flat cable to the second flexible flat cable, wherein the connector apparatus comprises:
        a first contact structure including a conductive strip, a first plurality of conductive interface members protruding from a first region of the conductive strip, and a second plurality of conductive interface members protruding from a second region of the conductive strip; and
        a contact mechanism for pressing the first contact structure against the first and second flexible flat cables such that the first plurality of conductive interface members contact the exposed free end of the first conductor and the second plurality of conductive interface members contact the exposed free end of second conductor, thereby providing an electrical path from the first conductor through the first plurality of conductive interface members to the conductive strip, and from the conductive strip through the second plurality of conductive interface members to the second conductor,
    wherein the first circuit structure comprises a first substrate defining a first plane and a first surface parallel to the first plane, the first substrate including a plurality of fixed conductors,
    wherein the first flexible flat cable is connected to the first surface such that a fixed end of the first flexible conductor is connected to a corresponding fixed conductor of the plurality of fixed conductors,
    wherein the second circuit structure comprises a second substrate defining a second plane and having an edge laying in the second plane,
    wherein the second flexible flat cable extends from the edge of the second substrate, and the second flexible conductor includes a fixed end electrically connected to at least one circuit mounted on the second substrate,
    wherein the second substrate is mounted such that the second plane forms a nonparallel angle relative to the first plane, and
    wherein at least one of the first flexible flat cable and the second flexible flat cable are bent to form a continuous curve between the first plane and the second plane.

2. The interconnect assembly according to claim 1, wherein the first substrate includes a rigid circuit board structure defining an outer surface, and wherein the first end of the first flexible flat cable is secured to the outer surface.

3. The interconnect assembly according to claim 2, wherein the first substrate defines an opening, and wherein the second end of the first flexible flat cable extends through the opening.

4. The interconnect assembly according to claim 1,
    wherein the first substrate includes a rigid circuit board structure and a second rigid circuit board structure defining a plurality of openings,
    wherein the first end of the first flexible flat cable is sandwiched between the first and second rigid circuit board structures, and
    wherein said second end of the first flexible flat cable extends through the opening.

5. The interconnect assembly according to claim 1, wherein the second substrate includes a rigid circuit board structure and a second rigid circuit board structure, and
    wherein said first end of the second flexible flat cable is sandwiched between the first and second rigid circuit board structures.

6. The interconnect assembly according to claim 2, wherein the second substrate includes a rigid circuit board structure defining an outer surface, and wherein the first end of the flexible flat cable is secured to the outer surface.

7. An interconnect assembly for transmitting high-speed signals between circuit structures, the assembly comprising:
    a first flexible flat cable having a first end connected to a first circuit structure and a second end extending from the first circuit structure, wherein the first flexible flat cable includes a first flexible conductor having a free end exposed on the second end of the first flexible flat cable;
    a second flexible flat cable having a first end connected to a second circuit structure and a second end extending from the second circuit structure, the second flexible flat cable including a second flexible conductor having a free end exposed on the second end of the second flexible flat cable; and
    a connector apparatus for detachably coupling the first flexible flat cable to the second flexible flat cable, wherein the connector apparatus comprises:
        a first contact structure including a conductive strip, a first plurality of conductive interface members protruding from a first region of the conductive strip, and a second plurality of conductive interface members protruding from a second region of the conductive strip; and
    a contact mechanism for pressing the first contact structure against the first and second flexible flat cables such that the first plurality of conductive interface members contact the exposed free end of the first conductor and the second plurality of conductive interface members contact the exposed free end of second conductor, thereby providing an electrical path from the first conductor through the first plurality of conductive interface members to the conductive strip, and from the conductive strip through the second plurality of conductive interface members to the second conductor,
    wherein the first circuit structure comprises a first substrate,
    wherein the connector apparatus further comprises a housing mounted on the first substrate, the housing defining an opening and a slit;
    wherein the second end of the first flexible flat cable extends through the first opening into the housing, and
    wherein the second end of the second flexible flat cable extends though the slit into the housing.

8. The interconnect assembly according to claim 7, wherein the contact mechanism comprises an actuating lever extending from the housing.

9. An interconnect assembly for transmitting high-speed signals between circuit structures, the assembly comprising:
- a first flexible flat cable having a first end connected to a first circuit structure and a second end extending from the first circuit structure, wherein the first flexible flat cable includes a first flexible conductor having a free end exposed on the second end of the first flexible flat cable;
- a second flexible flat cable having a first end connected to a second circuit structure and a second end extending from the second circuit structure, the second flexible flat cable including a second flexible conductor having a free end exposed on the second end of the second flexible flat cable; and
- a connector apparatus for detachably coupling the first flexible flat cable to the second flexible flat cable, wherein the connector apparatus comprises:
  - a first contact structure including a conductive strip, a first plurality of conductive interface members protruding from a first region of the conductive strip, and a second plurality of conductive interface members protruding from a second region of the conductive strip; and
  - a contact mechanism for pressing the first contact structure against the first and second flexible flat cables such that the first plurality of conductive interface members contact the exposed free end of the first conductor and the second plurality of conductive interface members contact the exposed free end of second conductor, thereby providing an electrical path from the first conductor through the first plurality of conductive interface members to the conductive strip, and from the conductive strip through the second plurality of conductive interface members to the second conductor, wherein each of the first and second flexible flat cables includes an associated alignment structure, wherein the connector apparatus further comprises an alignment plate for engaging the alignment structures formed on the first and second flexible flat cables, and for applying a force to a first side of the first and second flat cables, wherein the contact mechanism further comprises means for engaging the alignment plate to the first and second flexible flat cables while the first contact structure is positioned away from the first and second flexible flat cables, and then pressing the first contact structure against the first and second flexible flat cables while the alignment plate remains engaged with the first and second flexible flat cables, and wherein said means comprises a cam mechanism.

* * * * *